(12) United States Patent
Choi

(10) Patent No.: US 12,317,495 B2
(45) Date of Patent: May 27, 2025

(54) SEMICONDUCTOR DEVICE AND METHOD OF MANUFACTURING THE SEMICONDUCTOR DEVICE

(71) Applicant: SK hynix Inc., Icheon-si (KR)

(72) Inventor: Kang Sik Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 79 days.

(21) Appl. No.: 18/479,311

(22) Filed: Oct. 2, 2023

(65) Prior Publication Data

US 2024/0032272 A1    Jan. 25, 2024

Related U.S. Application Data

(62) Division of application No. 17/354,904, filed on Jun. 22, 2021, now Pat. No. 11,812,602.

(30) Foreign Application Priority Data

Dec. 10, 2020    (KR) .................. 10-2020-0172668

(51) Int. Cl.
  *H10B 43/30*   (2023.01)
  *H10B 12/00*   (2023.01)

(52) U.S. Cl.
  CPC ............. *H10B 43/30* (2023.02); *H10B 12/03* (2023.02); *H10B 12/05* (2023.02); *H10B 12/30* (2023.02)

(58) Field of Classification Search
  None
  See application file for complete search history.

(56) References Cited

U.S. PATENT DOCUMENTS

| | | | |
|---|---|---|---|
| 5,292,679 A | 3/1994 | Anzai | |
| 9,190,499 B2 | 11/2015 | Hirai et al. | |
| 9,716,137 B1 | 7/2017 | Hu et al. | |
| 2009/0294907 A1 | 12/2009 | Tegen et al. | |
| 2009/0302477 A1 | 12/2009 | Shor et al. | |
| 2015/0318296 A1* | 11/2015 | Kim ................ | H10B 41/27 257/296 |
| 2017/0179148 A1 | 6/2017 | Kwon et al. | |
| 2018/0269203 A1 | 9/2018 | Nojima | |

FOREIGN PATENT DOCUMENTS

KR    1020170022477 A    3/2017

* cited by examiner

*Primary Examiner* — Michelle Mandala
*Assistant Examiner* — Kevin Quinto
(74) *Attorney, Agent, or Firm* — WILLIAM PARK & ASSOCIATES LTD.

(57) ABSTRACT

Provided herein may be a semiconductor device. The semiconductor device may include a first stacked body including a first stacked insulating layer and a first stacked conductive layer that are alternately stacked; a capacitor plug passing through the first stacked body; and a capacitor multi-layered layer configured to enclose the capacitor plug. The capacitor plug may include metal.

9 Claims, 22 Drawing Sheets

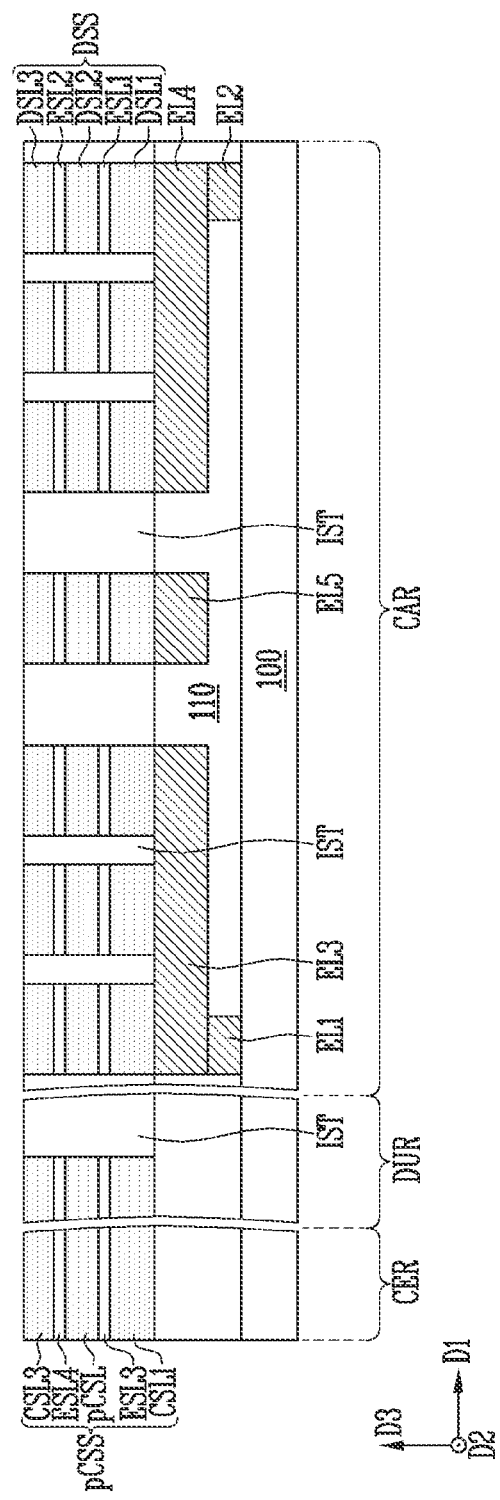

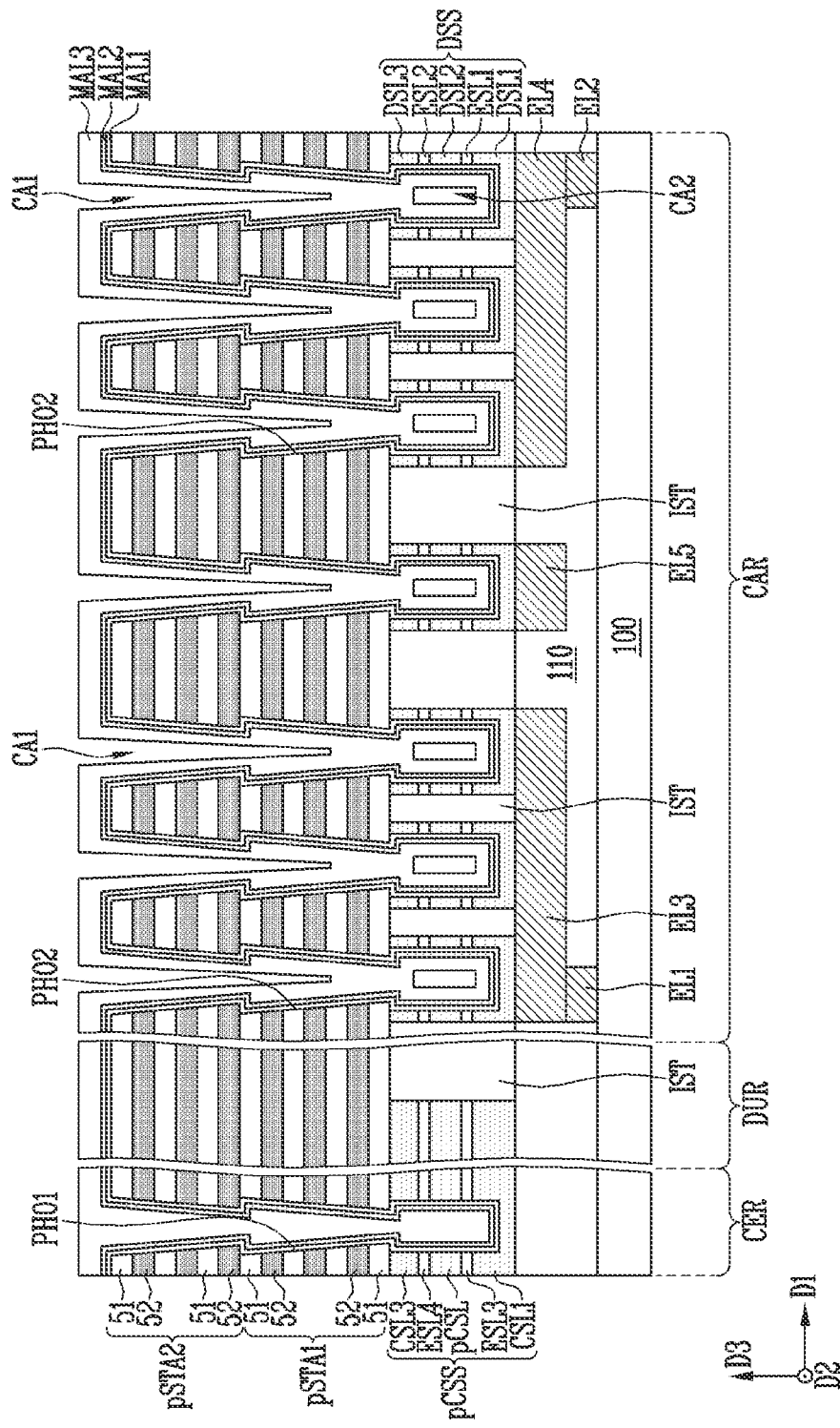

SEMICONDUCTOR DEVICE AND METHOD OF MANUFACTURING THE SEMICONDUCTOR DEVICE

CROSS-REFERENCE TO RELATED APPLICATION

The present application is a divisional application of U.S. patent application Ser. No. 17/354,904, filed on Jun. 22, 2021, and claims priority under 35 U.S.C. § 119(a) to Korean patent application number 10-2020-0172668 filed on Dec. 10, 2020, in the Korean Intellectual Property Office, the entire disclosure of which is incorporated by reference herein.

BACKGROUND

1. Technical Field

Various embodiments of the present disclosure generally relate to a semiconductor device and a method of manufacturing the semiconductor device, and more particularly, to a three-dimensional (3D) semiconductor device and a method of manufacturing the 3D semiconductor device.

2. Related Art

A semiconductor memory device includes memory cells capable of storing data. A 3D semiconductor memory device includes memory cells arranged in 3D, thereby reducing the area occupied by memory cells per unit area of a substrate.

In order to improve a level of integration in a 3D semiconductor memory device, the number of stacked memory cells may be increased. As the number of stacked memory cells is increased, the operation reliability of the 3D semiconductor memory device may be degraded.

SUMMARY

An embodiment of the present disclosure may provide for a semiconductor device. The semiconductor device may include a first stacked body including a first stacked insulating layer and a first stacked conductive layer that are alternately stacked, a capacitor plug passing through the first stacked body, and a capacitor multi-layered layer configured to enclose the capacitor plug. The capacitor plug may include metal.

An embodiment of the present disclosure may provide for a semiconductor device. The semiconductor device may include a first stacked body including a first stacked insulating layer and a first stacked conductive layer that are alternately stacked, a capacitor plug passing through the first stacked body, a capacitor insulating layer configured to enclose the capacitor plug, and a capacitor multi-layered layer configured to enclose the capacitor insulating layer.

An embodiment of the present disclosure may provide for a semiconductor device. The semiconductor device may include a first stacked body including a first stacked insulting layer and a first stacked conductive layer that are alternately stacked, first capacitor plugs passing through the first stacked body, first capacitor multi-layered layers configured to enclose the respective first capacitor plugs, second capacitor plugs passing through the first stacked body, second capacitor multi-layered layers configured to enclose the respective second capacitor plugs, a first electrode coupled to the first capacitor plugs, and a second electrode coupled to the second capacitor plugs. The first electrode and the second electrode may be electrically separated from each other.

An embodiment of the present disclosure may provide for a method of manufacturing a semiconductor device. The method may include forming a preliminary stacked body by alternately stacking preliminary stacked insulating layers and preliminary stacked sacrificial layers, forming a first through hole and a second through hole, each passing through the preliminary stacked body, forming a first material layer on a surface of the first through hole and a surface of the second through hole, forming a second material layer on the first material layer, separating the first material layer into a memory layer in the first through hole and a capacitor multi-layered layer in the second through hole, separating the second material layer into a channel layer in the first through hole and a preliminary capacitor insulating layer in the second through hole, and oxidizing the preliminary capacitor insulating layer, thereby forming a capacitor insulating layer.

BRIEF DESCRIPTION OF THE DRAWINGS

FIGS. 2A, 2B, 2C, 2D, 2E, 2F, 2G, 2H, 2I, 2J, 2K, 2L, 2M, 2N and 2O are sectional views for explaining a method of manufacturing a semiconductor device according to an embodiment of the present disclosure.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

It will be understood that, although the terms first, second, third etc. may be used herein to describe various elements, components, regions, layers, capacitors, bodies, plugs, structures, electrodes, and/or sections, these elements, components, regions, layers, capacitors, bodies, plugs, structures, electrodes, and/or sections should not be limited by these terms. These terms are only used to distinguish one element, component, region, layer, capacitor, body, plug, structure, electrode, and/or section from another element, component, region, layer, capacitor, body, plug, structure, electrode, and/or section. Thus, a first element, component, region, layer, capacitor, body, plug, structure, electrode, and/or section discussed below could be termed a second element, component, region, layer, capacitor, body, plug, structure, electrode, and/or section without departing from the teachings of the present disclosure.

Various embodiments of the present disclosure may be directed to a semiconductor device having improved operation reliability and a method of manufacturing the semiconductor device.

Figure 1A:
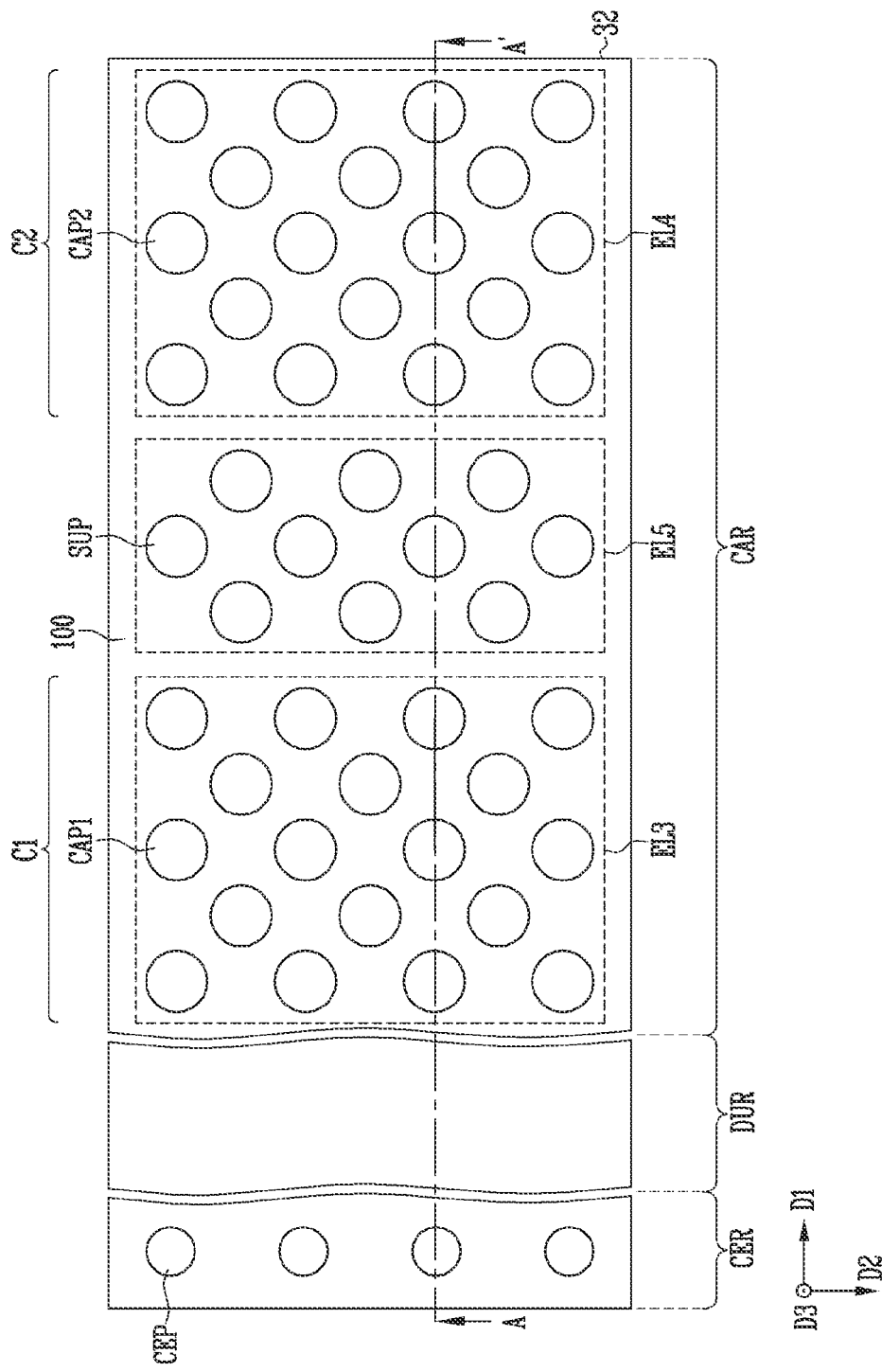
FIG. 1A is a plan view of a semiconductor device according to an embodiment of the present disclosure.
Figure 1B:
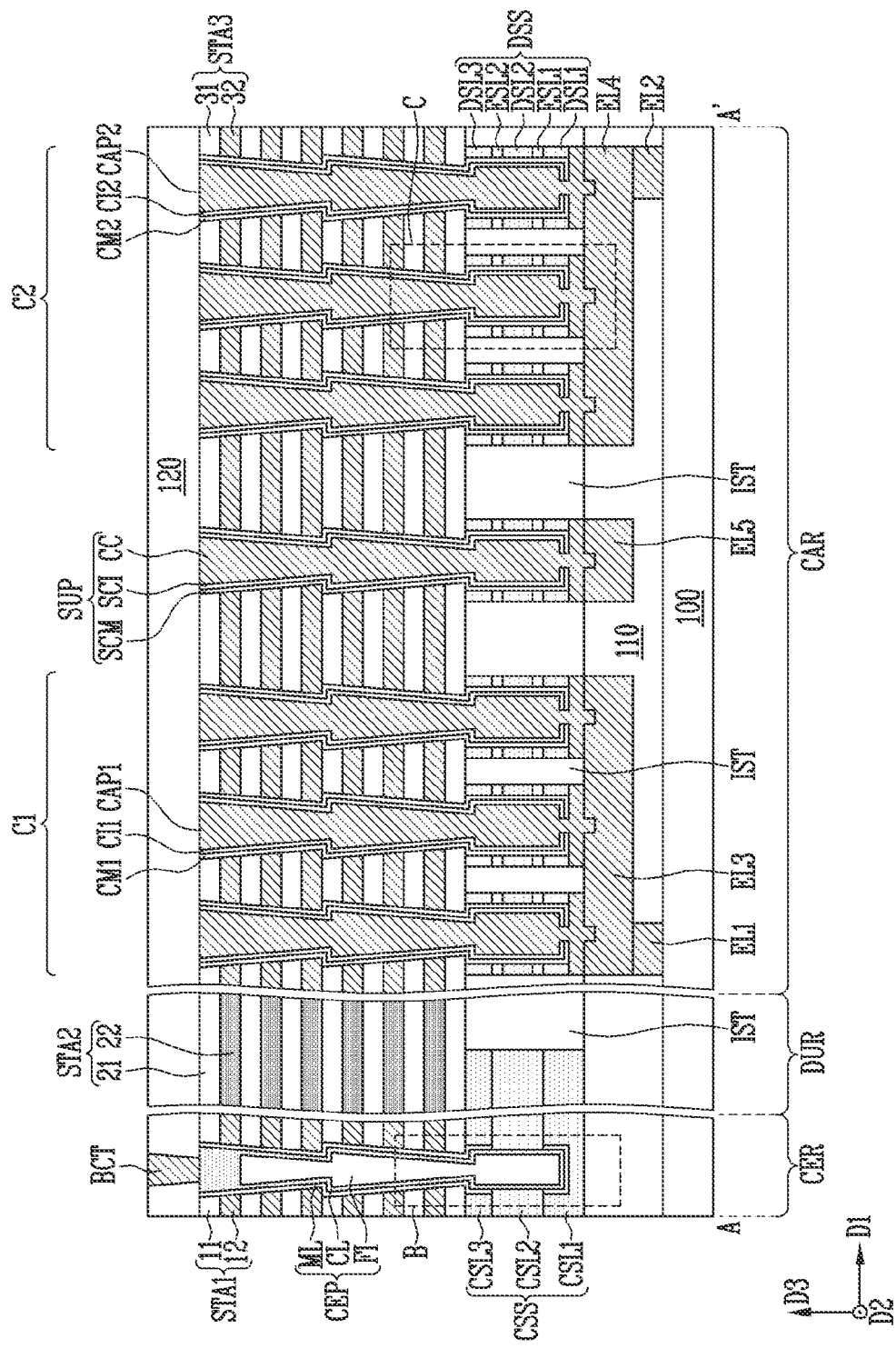
FIG. 1B is a sectional view taken along the line A-A' of FIG. 1A.
Figure 1C:
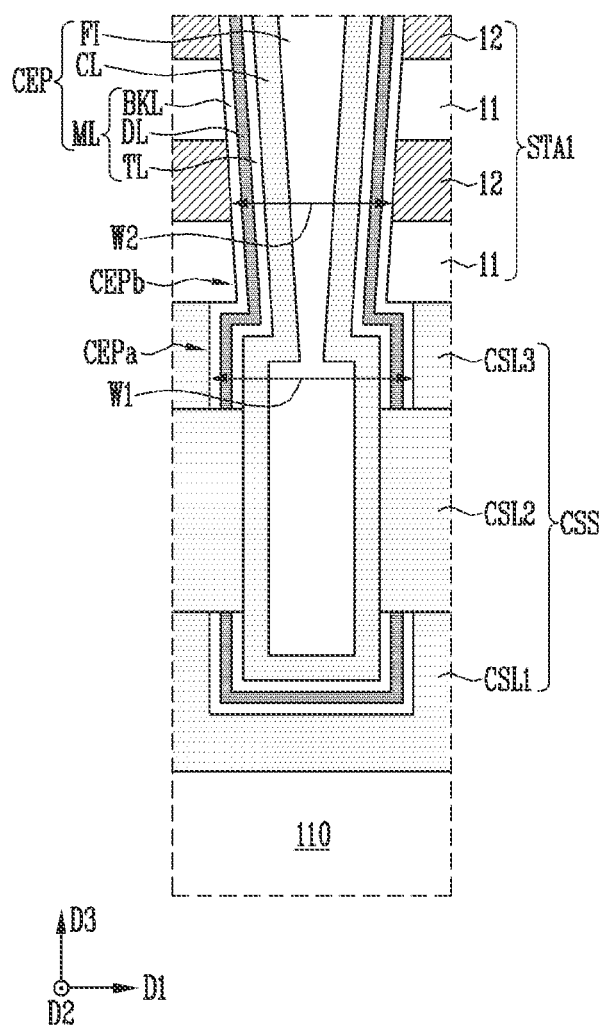
FIG. 1C is an enlarged view of the area B of FIG. 1B.
Figure 1D:
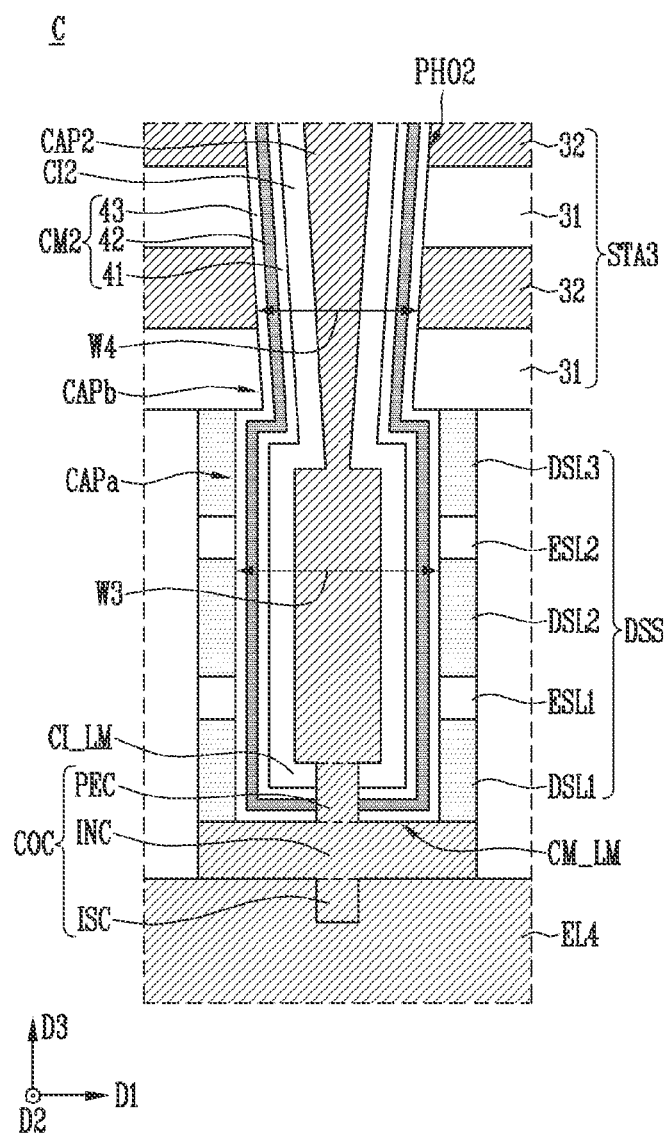
FIG. 1D is an enlarged view of the area C of FIG. 1B.

FIG. 1A is a plan view of a semiconductor device according to an embodiment of the present disclosure. FIG. 1B is a sectional view taken along the line A-A' of FIG. 1A. FIG. 1C is an enlarged view of the area B of FIG. 1B. FIG. 1D is an enlarged view of the area C of FIG. 1B.

Referring to FIGS. 1A and 1B, a semiconductor device may include a substrate 100. The substrate 100 may have the shape of a plate extending along a plane defined by a first direction D1 and a second direction D2. The first direction D1 and the second direction D2 may intersect with each other. For example, the first direction D1 and the second direction D2 may be perpendicular to each other. The substrate 100 may include a semiconductor material. For example, the substrate 100 may include silicon.

The substrate 100 may include a cell region CER, a dummy region DUR, and a capacitor region CAR. The cell region CER, the dummy region DUR, and the capacitor region CAR may be regions that are identified when viewed in the plane defined by the first direction D1 and the second direction D2. The dummy region DUR may be disposed between the cell region CER and the capacitor region CAR.

A first insulating layer 110 configured to cover the substrate 100 may be provided. The first insulating layer 110 may include an insulating material. For example, the first insulating layer 110 may include an oxide or a nitride.

A first electrode EL1, a second electrode EL2, a third electrode EL3, and a fourth electrode EL4 may be provided in the first insulating layer 110. The first to fourth electrodes EL1, EL2, EL3 and EL4 may be provided on the capacitor region CAR.

The first electrode EL1 may be coupled to the third electrode EL3. The second electrode EL2 may be coupled to the fourth electrode EL4. The first and second electrodes EL1 and EL2 may be disposed at the same level. The third and fourth electrodes EL3 and EL4 may be disposed at the same level. The third and fourth electrodes EL3 and EL4 may be disposed at a higher level than the first and second electrodes EL1 and EL2. The first electrode EL1 may be spaced apart from the second electrode EL2 and the fourth electrode EL4 in the first direction D1. The third electrode EL3 may be spaced apart from the second electrode EL2 and the fourth electrode EL4 in the first direction D1. The first electrode EL1 may be electrically separated from the second electrode EL2 and the fourth electrode EL4. The third electrode EL3 may be electrically separated from the second electrode EL2 and the fourth electrode EL4. The first to fourth electrodes EL1, EL2, EL3 and EL4 may include a conductive material.

A fifth electrode EL5 may be further provided in the first insulating layer 110. The fifth electrode EL5 may be provided on the capacitor region CAR. The fifth electrode EL5 may be located at the same level as the third electrode EL3 or the fourth electrode EL4. The fifth electrode EL5 may be electrically separated from the first to fourth electrodes EL1 to EL4. The fifth electrode EL5 may be in an electrically floating state. The fifth electrode EL5 may include a conductive material.

A cell source structure CSS, dummy source structures DSS, and insulating structures IST may be provided on the first insulating layer 110.

The cell source structure CSS may extend from the cell region CER to the dummy region DUR. The cell source structure CSS may include a first cell source layer CSL1, a second cell source layer CSL2, and a third cell source layer CSL3, which are sequentially stacked in a third direction D3. The third direction D3 may intersect with the first direction D1 and the second direction D2. For example, the third direction D3 may be perpendicular to the first direction D1 and the second direction D2. The first to third cell source layers CSL1, CSL2 and CSL3 of the cell source structure CSS may include a conductive material. For example, the first to third cell source layers CSL1, CSL2 and CSL3 of the cell source structure CSS may include doped polysilicon.

Each of the dummy source structures DSS may be provided on the capacitor region CAR. The dummy source structure DSS may include a first dummy source layer DSL1, a first etching stop layer ESL1, a second dummy source layer DSL2, a second etching stop layer ESL2, and a third dummy source layer DSL3, which are sequentially stacked in the third direction D3. The first to third dummy source layers DSL1, DSL2 and DSL3 may include a semiconductor material. For example, the first to third dummy source layers DSL1, DSL2 and DSL3 may include polysilicon. The first and second etching stop layers ESL1 and ESL2 may include a material having an etching selectivity with respect to the material included in the first to third dummy source layers DSL1, DSL2 and DSL3. For example, the first and second etching stop layers ESL1 and ESL2 may include an oxide.

Each of the insulating structures IST may be provided between the cell source structure CSS and the dummy source structure DSS or between the dummy source structures DSS. The insulating structure IST may separate the cell source structure CSS from the dummy source structure DSS or may separate the dummy source structures DSS from each other. The insulating structure IST may include an insulating material. For example, the insulating structure IST may include an oxide.

A first stacked body STA1 may be provided over the cell region CER. The first stacked body STA1 may be provided on the cell source structure CSS. The first stacked body STA1 may include first stacked insulating layers 11 and first stacked conductive layers 12, which are alternately stacked in the third direction D3.

The first stacked conductive layers 12 may be used as word lines or select lines of the semiconductor device. The first stacked conductive layers 12 may include a conductive material. The first stacked insulating layers 11 may include an insulating material. For example, the first stacked insulating layers 11 may include an oxide.

A second stacked body STA2 may be provided over the dummy region DUR. The second stacked body STA2 may be provided on the cell source structure CSS and the insulating structure IST. The second stacked body STA2 may include second stacked insulating layers 21 and second stacked sacrificial layers 22, which are alternately stacked in the third direction D3.

The second stacked insulating layers 21 may include an insulating material. For example, the second stacked insulating layers 21 may include an oxide. The second stacked sacrificial layers 22 may include a material different from the material of the second stacked insulating layers 21. For example, the second stacked sacrificial layers 22 may include a nitride.

A third stacked body STA3 may be provided over the capacitor region CAR. The third stacked body STA3 may be provided on the dummy source structures DSS and the insulating structures IST. The third stacked body STA3 may include third stacked insulating layers 31 and second stacked conductive layers 32, which are alternately stacked in the third direction D3.

The third stacked insulating layers 31 may include an insulating material. For example, the third stacked insulating layers 31 may include an oxide. The second stacked conductive layers 32 may include a conductive material.

Cell plugs CEP passing through the first stacked body STA1 may be provided. The cell plugs CEP may extend in the third direction D3. The cell plugs CEP may be provided over the cell region CER. The lower portion of the cell plug CEP may be provided in the cell source structure CSS. The cell plug CEP may include a filling layer FI, a channel layer CL configured to enclose the filling layer FI, and a memory layer ML configured to enclose the channel layer CL.

The filling layer FI may extend in the third direction D3. The filling layer FI may include an insulating material. For example, the filling layer FI may include an oxide.

The channel layer CL may extend in the third direction D3. The channel layer CL may include a semiconductor material. For example, the channel layer CL may include polysilicon. The channel layer CL may be coupled to the second cell source layer CSL2 of the cell source structure CSS. The channel layer CL may come into contact with the second cell source layer CSL2 of the cell source structure CSS. The channel layer CL may be electrically coupled to the second cell source layer CSL2 of the cell source structure CSS.

The memory layer ML may extend in the third direction D3. The second cell source layer CSL2 of the cell source structure CSS may be coupled to the channel layer CL by passing through the memory layer ML.

First capacitor plugs CAP1 passing through the third stacked body STA3 and second capacitor plugs CAP2 passing through the third stacked body STA3 may be provided. The first and second capacitor plugs CAP1 and CAP2 may extend in the third direction D3. The first and second capacitor plugs CAP1 and CAP2 may be provided over the capacitor region CAR. The lower portion of each of the first and second capacitor plugs CAP1 and CAP2 may be provided in the dummy source structure DSS.

A first capacitor insulating layer CI1 and a first capacitor multi-layered layer CM1 that are configured to enclose the sidewall of each of the first capacitor plugs CAP1 may be provided. The first capacitor insulating layer CI1 may cover the outer sidewall of the first capacitor plug CAP1. The first capacitor multi-layered layer CM1 may cover the outer sidewall of the first capacitor insulating layer CI1. A second capacitor insulating layer CI2 and a second capacitor multi-layered layer CM2 that are configured to enclose the sidewall of each of the second capacitor plugs CAP2 may be provided. The second capacitor insulating layer CI2 may cover the outer sidewall of the second capacitor plug CAP2. The second capacitor multi-layered layer CM2 may cover the outer sidewall of the second capacitor insulating layer CI2.

Support plugs SUP passing through the third stacked body STA3 may be provided. The support plugs SUP may extend in the third direction D3. The support plugs SUP may be provided over the capacitor region CAR. The lower portion of each of the support plugs SUP may be provided in the dummy source structure DSS. Each of the support plugs SUP may include a conductive plug CC, a sidewall insulating layer SCI, and a sidewall multi-layered layer SCM. The sidewall insulating layer SCI may cover the outer sidewall of the conductive plug CC. The sidewall multi-layered layer SCM may cover the outer sidewall of the sidewall insulating layer SCI. The third stacked body STA3 and the dummy source structure DSS may come into contact with the outer sidewalls of the first capacitor multi-layered layer CM1, the second capacitor multi-layered layer CM2, and the sidewall multi-layered layer SCM.

The first capacitor plug CAP1, the second capacitor plug CAP2, and the conductive plug CC may include the same materials, and may include a conductive material. The first capacitor plug CAP1, the second capacitor plug CAP2, and the conductive plug CC may include a material different from the material of the channel layer CL. For example, the first capacitor plug CAP1, the second capacitor plug CAP2, and the conductive plug CC may include metal. The first capacitor insulating layer CI1, the second capacitor insulating layer CI2, and the sidewall insulating layer SCI may include an insulating material. For example, the first capacitor insulating layer CI1, the second capacitor insulating layer CI2, and the sidewall insulating layer SCI may include an oxide. Each of the first capacitor multi-layered layer CM1, the second capacitor multi-layered layer CM2, and the sidewall multi-layered layer SCM may be a multi-layered insulating layer. The first capacitor multi-layered layer CM1, the second capacitor multi-layered layer CM2, and the sidewall multi-layered layer SCM may include the same material as the memory layer ML.

The first capacitor plugs CAP1 may be electrically coupled to the third electrode EL3 and the first electrode EL1. The third electrode EL3 may be disposed under the first capacitor plugs CAP1. The second capacitor plugs CAP2 may be electrically coupled to the fourth electrode EL4 and the second electrode EL2. The fourth electrode EL4 may be disposed under the second capacitor plugs CAP2. The second capacitor plugs CAP2 may be spaced apart from the first capacitor plugs CAP1 in the first direction D1. The support plugs SUP may be disposed between the first capacitor plugs CAP1 and the second capacitor plugs CAP2. The support plugs SUP may be spaced apart from the first capacitor plugs CAP1 in the first direction D1, and may be spaced apart from the second capacitor plugs CAP2 in the first direction D1. The support plugs SUP may be electrically separated from the first to fourth electrodes EL1, EL2, EL3 and EL4. The first capacitor plugs CAP1, the second capacitor plugs CAP2, and the support plugs SUP may be enclosed by the second stacked conductive layers 32.

A second insulting layer 120 configured to cover the first to third stacked bodies STA1, STA2 and STA3 may be provided. The second insulating layer 120 may include an insulating material. For example, the second insulating layer 120 may include an oxide or a nitride.

Bit line contacts BCT passing through the second insulating layer 120 may be provided. The respective bit line contacts BCT may be coupled to the corresponding ones of the cell plugs CEP. Although not illustrated, the bit line contact BCT may be electrically coupled to the bit line of the semiconductor device. The bit line contact BCT may include a conductive material. For example, the bit line contact BCT may include tungsten.

According to the above-described structure, the first capacitor plugs CAP1 may form a first capacitor C1. The first capacitor C1 may further include the second stacked conductive layers 32, the first capacitor multi-layered layers CM1, the first capacitor insulating layer CI1, or the third electrode EL3, or may further include a combination thereof. The first capacitor plugs CAP1 electrically coupled to each other through the third electrode EL3 may be used as the first electrode structure of the first capacitor C1. The second stacked conductive layers 32 may be used as the second electrode structure of the first capacitor C1. The first capacitor insulating layer CI1 and the first capacitor multi-layered layer CM1 may be used as a dielectric interposed between the first electrode structure and the second electrode structure.

The second capacitor plugs CAP2 may form a second capacitor C2. The second capacitor C2 may further include the second stacked conductive layers 32, the second capacitor multi-layered layers CM2, the second capacitor insulating layer CI2, or the fourth electrode EL4, or may further include a combination thereof. The second capacitor plugs CAP2 electrically coupled to each other through the fourth electrode EL4 may be used as the first electrode structure of the second capacitor C2. The second stacked conductive layers 32 may be used as the second electrode structure of the second capacitor C2. The second capacitor insulating layer CI2 and the second capacitor multi-layered layer CM2 may be used as a dielectric interposed between the first electrode structure and the second electrode structure.

Also, the first capacitor C1 and the second capacitor C2 share the second stacked conductive layers 32. That is, because the first capacitor C1 and the second capacitor C2 share the second electrode structure, the first capacitor C1 and the second capacitor C2 may be coupled in parallel to each other. The support plugs SUP are electrically coupled to the fifth electrode EL5, but because the fifth electrode EL5 is in a floating state, the support plugs SUP may also be in an electrically floating state.

Referring to FIGS. 1C and 1D, the memory layer ML of the cell plug CEP may include a tunnel insulating layer TL configured to enclose the channel layer CL, a data storage layer DL configured to enclose the tunnel insulating layer TL, and a blocking layer BKL configured to enclose the data storage layer DL. The tunnel insulating layer TL may include a material that allows charge tunneling. For example, the tunnel insulating layer TL may include an oxide. The data storage layer DL may include a material that allows charge trapping. For example, the data storage layer DL may include a nitride. The blocking layer BKL may include a material capable of blocking the movement of charges. For example, the blocking layer BKL may include an oxide.

The cell plug CEP may include a lower portion CEPa disposed in the cell source structure CSS and an upper portion CEPb disposed in the first stacked body STA1. The cell source structure CSS may enclose the lower portion CEPa of the cell plug CEP. The first stacked body STA1 may enclose the upper portion CEPb of the cell plug CEP.

The maximum width of the lower portion CEPa of the cell plug CEP may be greater than the minimum width of the upper portion CEPb of the cell plug CEP. For example, the width of the lower portion CEPa of the cell plug CEP in the first direction D1 may be defined as a first width W1, the width of the upper portion CEPb of the cell plug CEP in the first direction D1 may be defined as a second width W2, and the maximum value of the first width W1 may be greater than the minimum value of the second width W2.

The second capacitor multi-layered layer CM2 may include a first layer 41, a second layer 42 configured to enclose the first layer 41, and a third layer 43 configured to enclose the second layer 42. The third layer 43 may enclose the first layer 41. The first layer 41 may cover the outer sidewall of the second capacitor insulating layer CI2. The second layer 42 may cover the outer sidewall of the first layer 41. The third layer 43 may cover the outer sidewall of the second layer 42. The third stacked body STA3 and the dummy source structure DSS may come into contact with the outer sidewall of the third layer 43.

The first layer 41 may include the same material as the tunnel insulating layer TL. For example, the first layer 41 and the tunnel insulating layer TL may include an oxide. The second layer 42 may include the same material as the data storage layer DL. For example, the second layer 42 and the data storage layer DL may include a nitride. The third layer 43 and the blocking layer BKL may include the same material. For example, the third layer 43 and the blocking layer BKL may include an oxide.

The second capacitor plug CAP2, the second capacitor multi-layered layer CM2, and the second capacitor insulating layer CI2 may be formed inside a second through hole PHO2 passing through the third stacked body STA3 and the dummy source structure DSS. The second through hole PHO2 may include a lower portion CAPa disposed in the dummy source structure DSS and an upper portion CAPb disposed in the third stacked body STA3. The maximum width of the lower portion CAPa of the second through hole PHO2 may be greater than the minimum width of the upper portion CAPb of the second through hole PHO2. For example, the width of the lower portion CAPa in the first direction D1 may be defined as a third width W3, the width of the upper portion CAPb in the first direction D1 may be defined as a fourth width W4, and the maximum value of the third width W3 may be greater than the minimum value of the fourth width W4. The first capacitor plug CAP1, the first capacitor multi-layered layer CM1, and the first capacitor insulating layer CI1 may have structures similar to the structures of the second capacitor plug CAP2, the second capacitor multi-layered layer CM2, and the second capacitor insulating layer CI2. The conductive plug CC, the sidewall multi-layered layer SCM, and the sidewall insulating layer SCI of the support plug SUP may have structures similar to the structures of the second capacitor plug CAP2, the second capacitor multi-layered layer CM2, and the second capacitor insulating layer CI2.

A connection conductor COC coupled to the second capacitor plug CAP2 may be provided. The connection conductor COC may be integrally coupled to the second capacitor plug CAP2 without a boundary. Another connection conductor COC coupled to the first capacitor plug CAP1 may electrically couple the first capacitor plug CAP1 to the third electrode EL3. The connection conductor COC coupled to the second capacitor plug CAP2 may electrically couple the second capacitor plug CAP2 to the fourth electrode EL4.

The connection conductor COC may include a penetrating conductive part PEC, an interposed conductive part INC, and an inserted conductive part ISC. The penetrating conductive part PEC may be coupled to the capacitor plug CAP. The top surface of the penetrating conductive part PEC may come into contact with the bottom surface of the second capacitor plug CAP2. The penetrating conductive part PEC may pass through the lowest portion CI_LM of the second capacitor insulating layer CI2. The penetrating conductive part PEC may pass through the lowest portion CM_LM of the second capacitor multi-layered layer CM2. The penetrating conductive part PEC may be enclosed by the lowest portion CI_LM of the second capacitor insulating layer CI2. The penetrating conductive part PEC may be enclosed by the lowest portion CM_LM of the second capacitor multi-layered layer CM2. The penetrating conductive part PEC, the interposed conductive part INC, and the inserted conductive part ISC of the connection conductor COC may include the same material as the second capacitor plug CAP2. For example, the penetrating conductive part PEC, the interposed conductive part INC, and the inserted conductive part ISC of the connection conductor COC may include the same metal as the second capacitor plug CAP2.

The interposed conductive part INC may be coupled to the penetrating conductive part PEC. The top surface of the interposed conductive part INC may come into contact with the bottom surface of the penetrating conductive part PEC. The top surface of the interposed conductive part INC may come into contact with the bottom surface of the lowest portion CM_LM of the second capacitor multi-layered layer CM2. The width of the interposed conductive part INC may be greater than the width of the penetrating conductive part PEC.

The interposed conductive part INC of the connection conductor COC coupled to the first capacitor plug CAP1 may be interposed between the lowest portion CM_LM of the first capacitor multi-layered layer CM1 and the third electrode EL3. The interposed conductive part INC of the connection conductor COC coupled to the first capacitor plug CAP1 may be interposed between the dummy source structure DSS and the third electrode EL3. The bottom surface of the interposed conductive part INC of the connection conductor COC coupled to the first capacitor plug CAP1 may come into contact with the top surface of the third electrode EL3. The interposed conductive part INC of the connection conductor COC coupled to the second capacitor plug CAP2 may be interposed between the lowest portion CM_LM of the second capacitor multi-layered layer CM2 and the fourth electrode EL4. The interposed conductive part INC of the connection conductor COC coupled to the second capacitor plug CAP2 may be interposed between the dummy source structure DSS and the fourth electrode EL4. The bottom surface of the interposed conductive part INC of the connection conductor COC coupled to the second capacitor plug CAP2 may come into contact with the top surface of the fourth electrode EL4. The interposed conductive part INC of the connection conductor COC coupled to the support plug SUP may be interposed between the lowest portion CM_LM of the sidewall multi-layered layer SCM and the first insulating layer 110. The interposed conductive part INC of the connection conductor COC coupled to the support plug SUP may be interposed between the dummy source structure DSS and the first insulating layer 110. The bottom surface of the interposed conductive part INC of the connection conductor COC coupled to the support plug SUP may come into contact with the fifth electrode EL5.

The inserted conductive part ISC may be coupled to the interposed conductive part INC. The top surface of the inserted conductive part ISC may come into contact with the bottom surface of the interposed conductive part INC. The width of the inserted conductive part ISC may be less than the width of the interposed conductive part INC. The width of the inserted conductive part ISC may be the same as the width of the penetrating conductive part PEC.

The inserted conductive part ISC of the connection conductor COC coupled to the first capacitor plug CAP1 may be disposed in the third electrode EL3. The inserted conductive part ISC of the connection conductor COC coupled to the first capacitor plug CAP1 may be enclosed by the third electrode EL3. The inserted conductive part ISC of the connection conductor COC coupled to the second capacitor plug CAP2 may be disposed in the fourth electrode EL4. The inserted conductive part ISC of the connection conductor COC coupled to the second capacitor plug CAP2 may be enclosed by the fourth electrode EL4. The inserted conductive part ISC of the connection conductor COC coupled to the support plug SUP may be disposed in the fifth electrode EL5 or may be disposed in the first insulating layer 110.

The semiconductor device according to embodiments of the present disclosure may increase the capacity of a capacitor by increasing the stacked number of second stacked conductive layers 32. Accordingly, the horizontal area of the semiconductor device may be minimized.

The semiconductor device according to embodiments of the present disclosure may include a first capacitor C1 and a second capacitor C2 coupled in parallel to each other, whereby the reliability of the semiconductor device may be improved.

FIGS. 2A, 2B, 2C, 2D, 2E, 2F, 2G, 2H, 2I, 2J, 2K, 2L, 2M, 2N and 2O are sectional views for explaining a method of manufacturing a semiconductor device according to an embodiment of the present disclosure. Hereinafter, a description redundant with the above description will be omitted.

Referring to FIG. 2A, a substrate 100 may be formed. A first insulating layer 110 may be formed on the substrate 100. First to fourth electrodes EL1, EL2, EL3 and EL4 may be formed in the first insulating layer 110. A fifth electrode EL5 may be further formed in the first insulating layer 110.

A preliminary cell source structure pCSS, dummy source structures DSS, and insulating structures IST may be formed on the first insulating layer 110. The preliminary cell source structure pCSS may include a first cell source layer CSL1, a third etching stop layer ESL3, a preliminary cell source layer pCSL, a fourth etching stop layer ESL4, and a third cell source layer CSL3, which are sequentially stacked in the third direction D3.

Forming the preliminary cell source structure pCSS, the dummy source structures DSS, and the insulating structures IST may include forming a first preliminary source layer, a first preliminary etching stop layer, a second preliminary source layer, a second preliminary etching stop layer, and a third preliminary source layer on the first insulating layer 110 and forming the insulating structures IST that separate the first preliminary source layer, the first preliminary etching stop layer, the second preliminary source layer, the second preliminary etching stop layer, and the third preliminary source layer.

Figure 2B:
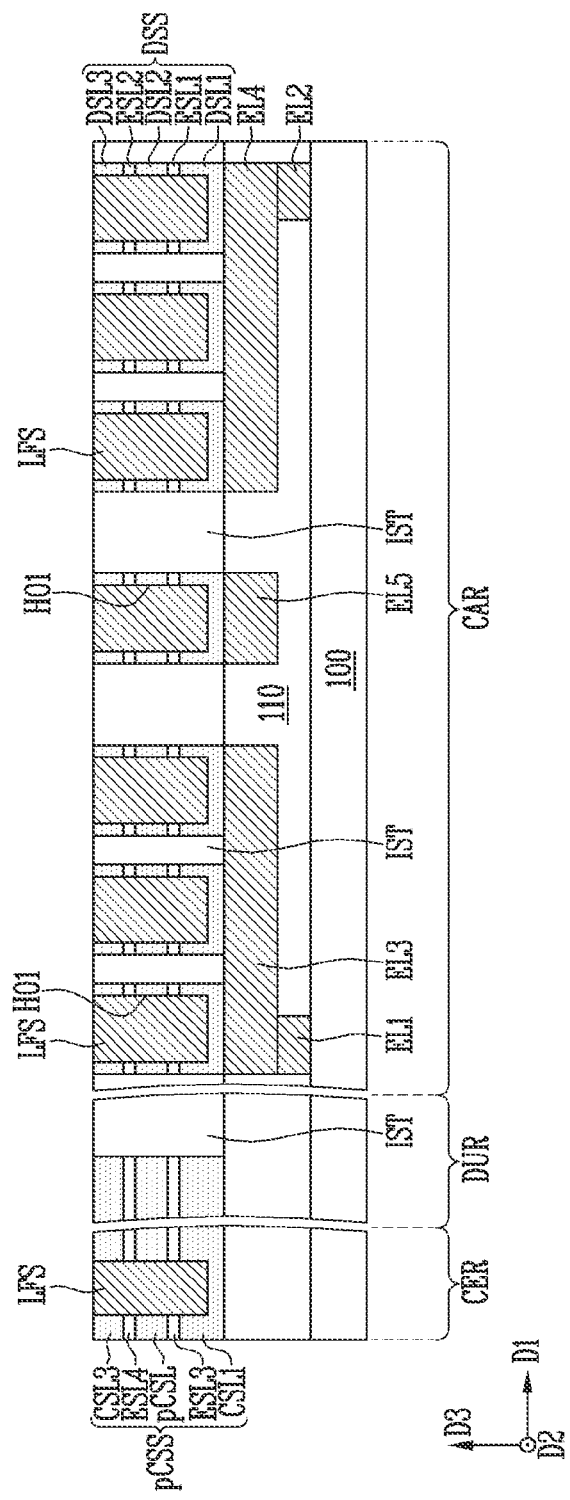

Referring to FIG. 2B, a lower sacrificial structure LFS may be formed in each of the preliminary cell source structure pCSS and the dummy source structures DSS. The width of the lower sacrificial structure LFS in the preliminary cell source structure pCSS may be the same as or different from the width of the lower sacrificial structure LFS in the dummy source structure DSS. In an embodiment, the width of the lower sacrificial structure LFS in the dummy source structure DSS may be greater than the width of the lower sacrificial structure LFS in the preliminary cell source structure pCSS.

Forming the lower sacrificial structures LFS may include forming a first hole HO1 in each of the preliminary cell source structure pCSS and the dummy source structures DSS and forming the lower sacrificial structure LFS in the first hole HO1. For example, the lower sacrificial structures LFS may include tungsten.

Figure 2C:
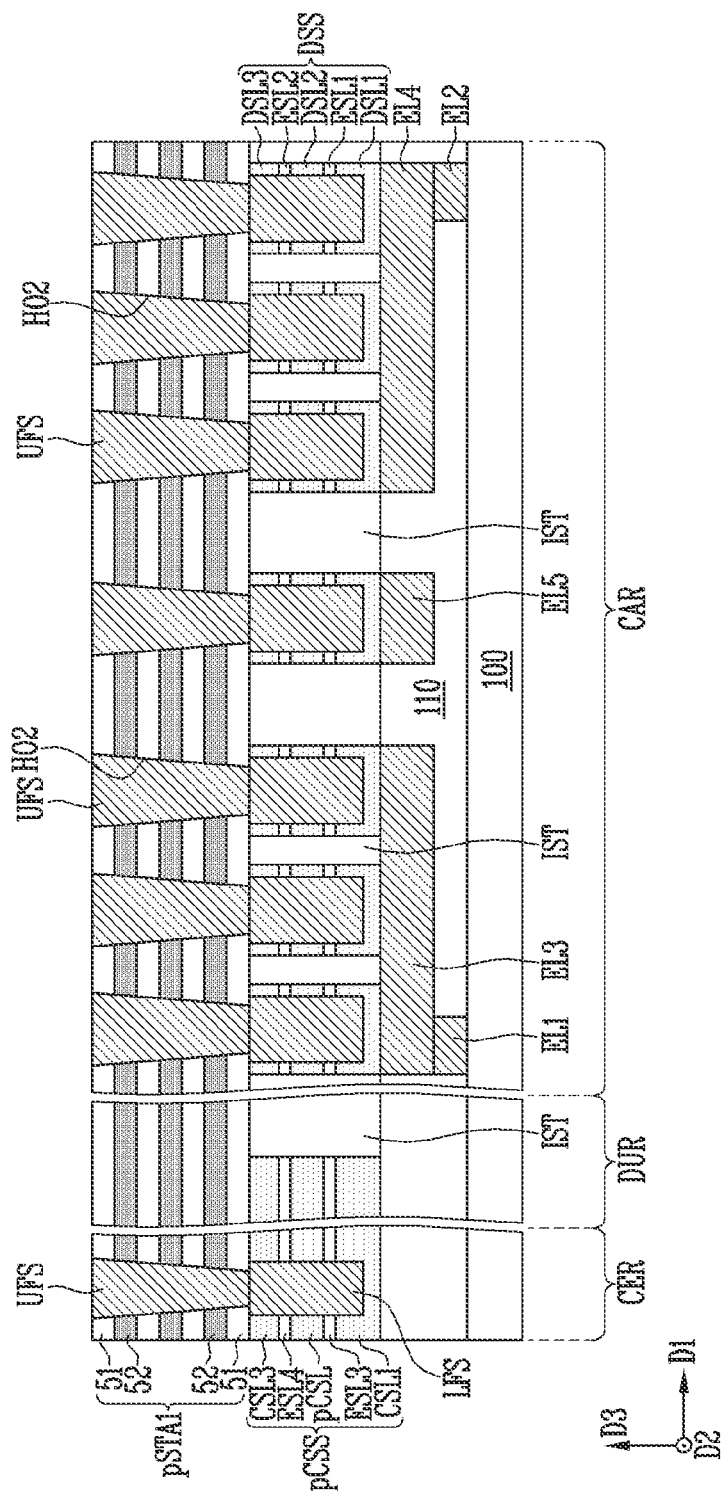

Referring to FIG. 2C, a first preliminary stacked body pSTA1 may be formed on the preliminary cell source structure pCSS, the dummy source structures DSS, and the insulating structures IST. Forming the first preliminary stacked body pSTA1 may include alternately stacking preliminary stacked insulating layers 51 and preliminary stacked sacrificial layers 52 on the preliminary cell source structure pCSS, the dummy source structures DSS, and the insulating structures IST.

Upper sacrificial structures UFS, each passing through the first preliminary stacked body pSTA1, may be formed. Each of the upper sacrificial structures UFS may be coupled to each of the lower sacrificial structures LFS. The width of the upper sacrificial structure UFS coupled to the lower sacrificial structure LFS of the preliminary cell source structure pCSS may be the same as or different from the width of the upper sacrificial structure UFS coupled to the lower sacrificial structure LFS of the dummy source structure DSS. In an embodiment, the width of the upper sacrificial structure UFS coupled to the lower sacrificial structure LFS of the dummy source structure DSS may be greater than the width of the upper sacrificial structure UFS coupled to the lower sacrificial structure LFS of the preliminary cell source structure pCSS.

Forming the upper sacrificial structures UFS may include forming second holes HO2 passing through the first preliminary stacked body pSTA1 and forming the upper sacrificial structures UFS in the second holes HO2. For example, the upper sacrificial structures UFS may include tungsten.

Figure 2D:
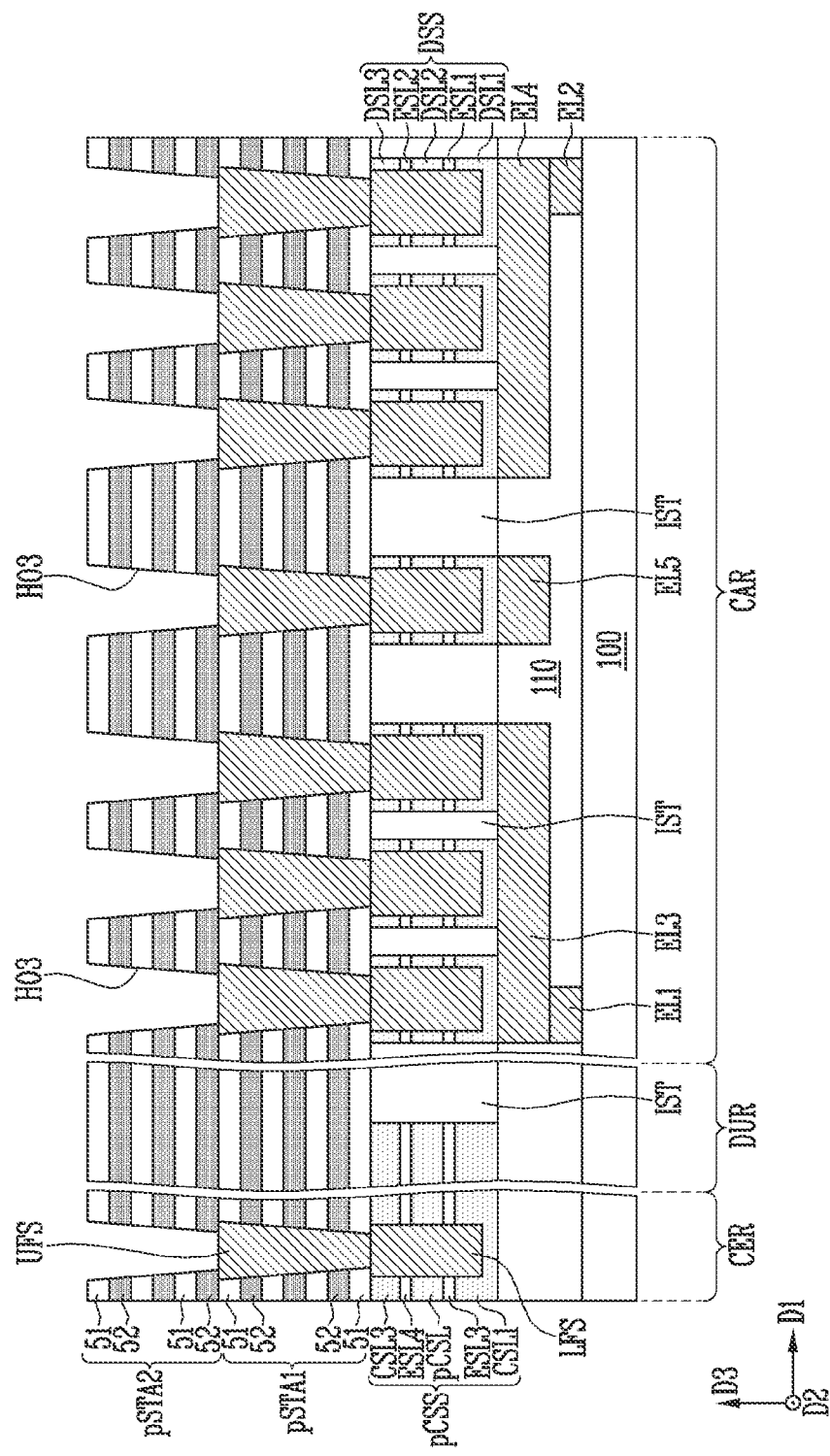

Referring to FIG. 2D, a second preliminary stacked body pSTA2 may be formed on the first preliminary stacked body pSTA1. Forming the second preliminary stacked body pSTA2 may include alternately stacking preliminary stacked insulating layers 51 and preliminary stacked sacrificial layers 52 on the first preliminary stacked body pSTA1.

Third holes HO3 passing through the second preliminary stacked body pSTA2 may be formed. By the third holes HO3, the upper sacrificial structures UFS may be exposed. The width of the third hole HO3 corresponding to the lower sacrificial structure LFS of the preliminary cell source structure pCSS may be the same as or different from the width of the third hole HO3 corresponding to the lower sacrificial structure LFS of the dummy source structure DSS. In an embodiment, the width of the third hole HO3 corresponding to the lower sacrificial structure LFS of the dummy source structure DSS may be greater than the width of the third hole HO3 corresponding to the lower sacrificial structure LFS of the preliminary cell source structure pCSS.

Figure 2E:
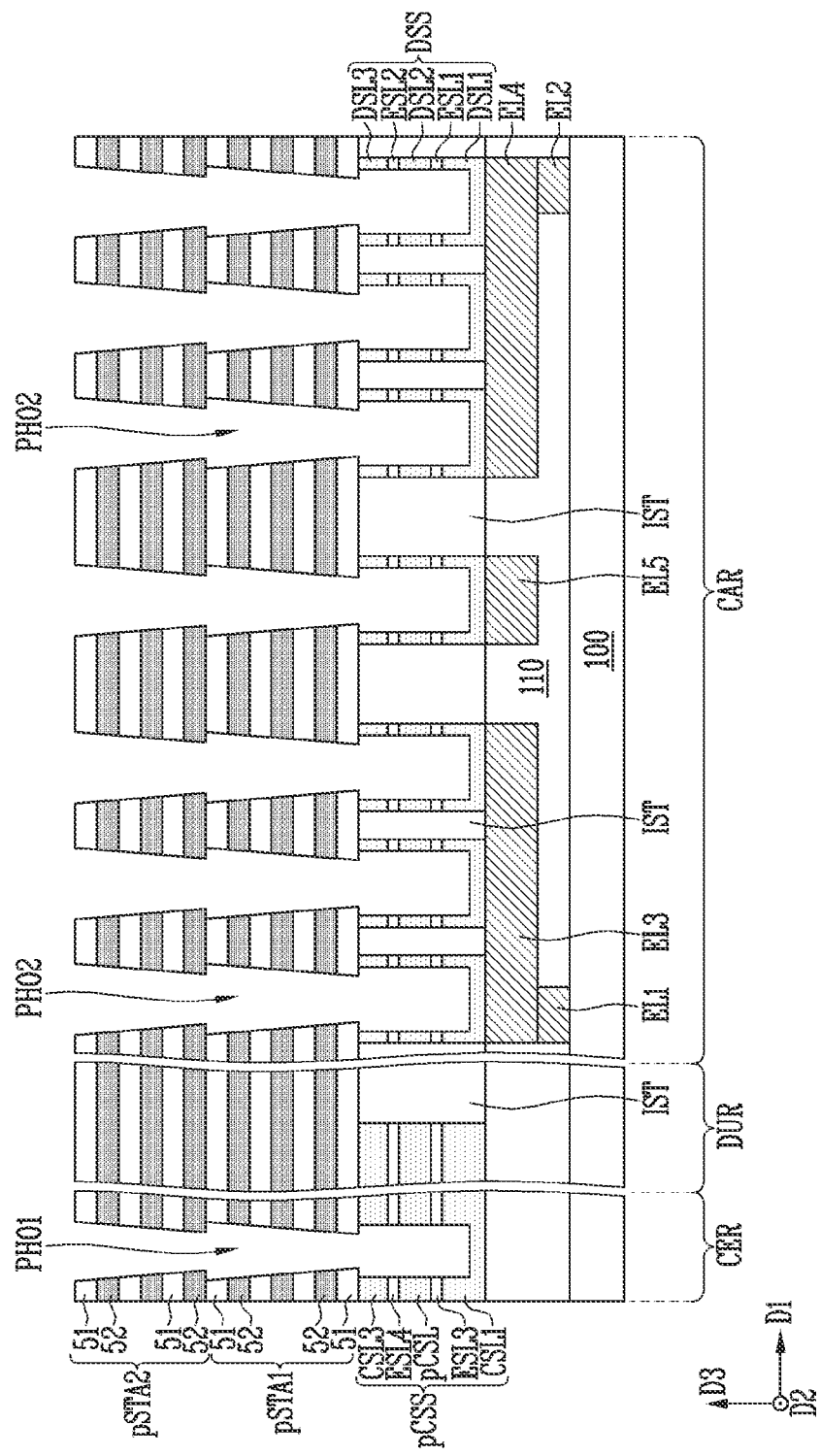

Referring to FIG. 2E, first through holes PHO1 and second through holes PHO2 may be formed. Forming the first through holes PHO1 and the second through holes PHO2 may include exposing the lower sacrificial structures LFS by removing the upper sacrificial structures UFS through the third holes HO3 and removing the lower sacrificial structures LFS.

The first to third holes HO1, HO2 and HO3 coupled to each other over the cell region CER may be defined as the first through hole PHO1. The first to third holes HO1, HO2 and HO3 coupled to each other over the capacitor region CAR may be defined as the second through hole PHO2.

Referring to FIG. 2F, a first material layer MAL1, a second material layer MAL2, and a third material layer MAL3 may be sequentially formed.

The first material layer MAL1 may be formed on the surfaces of the first through holes PHO1 and the second through holes PHO2. The second material layer MAL2 may be formed on the first material layer MAL1. The third material layer MAL3 may be formed on the second material layer MAL2. The first material layer MAL1 may be a multi-layered insulating layer. The second material layer MAL2 may include polysilicon. The third material layer MAL3 may include an oxide.

The first and second material layers MAL1 and MAL2 may fill a portion of the first through hole PHO1. The third material layer MAL3 may completely fill the first through hole PHO1. The first to third material layers MAL1, MAL2 and MAL3 may fill a portion of the second through hole PHO2. A portion of the second through hole PHO2 that is not filled with the first to third material layers MAL1, MAL2 and MAL3 may be defined as a first cavity CA1 and a second cavity CA2. The first cavity CA1 and the second cavity CA2 may be defined by the surface of the third material layer MAL3.

The first cavity CA1 may be coupled to the space on the second stacked body STA2. In other words, the first cavity CA1 may be opened. The first cavity CA1 may extend to the first preliminary stacked body pSTA1 by passing through the second preliminary stacked body pSTA2. The second cavity CA2 may be enclosed by the third material layer MAL3. In other words, the second cavity CA2 may be closed by the third material layer MAL3. The second cavity CA2 may be disposed in the dummy source structure DSS.

Figure 2G:
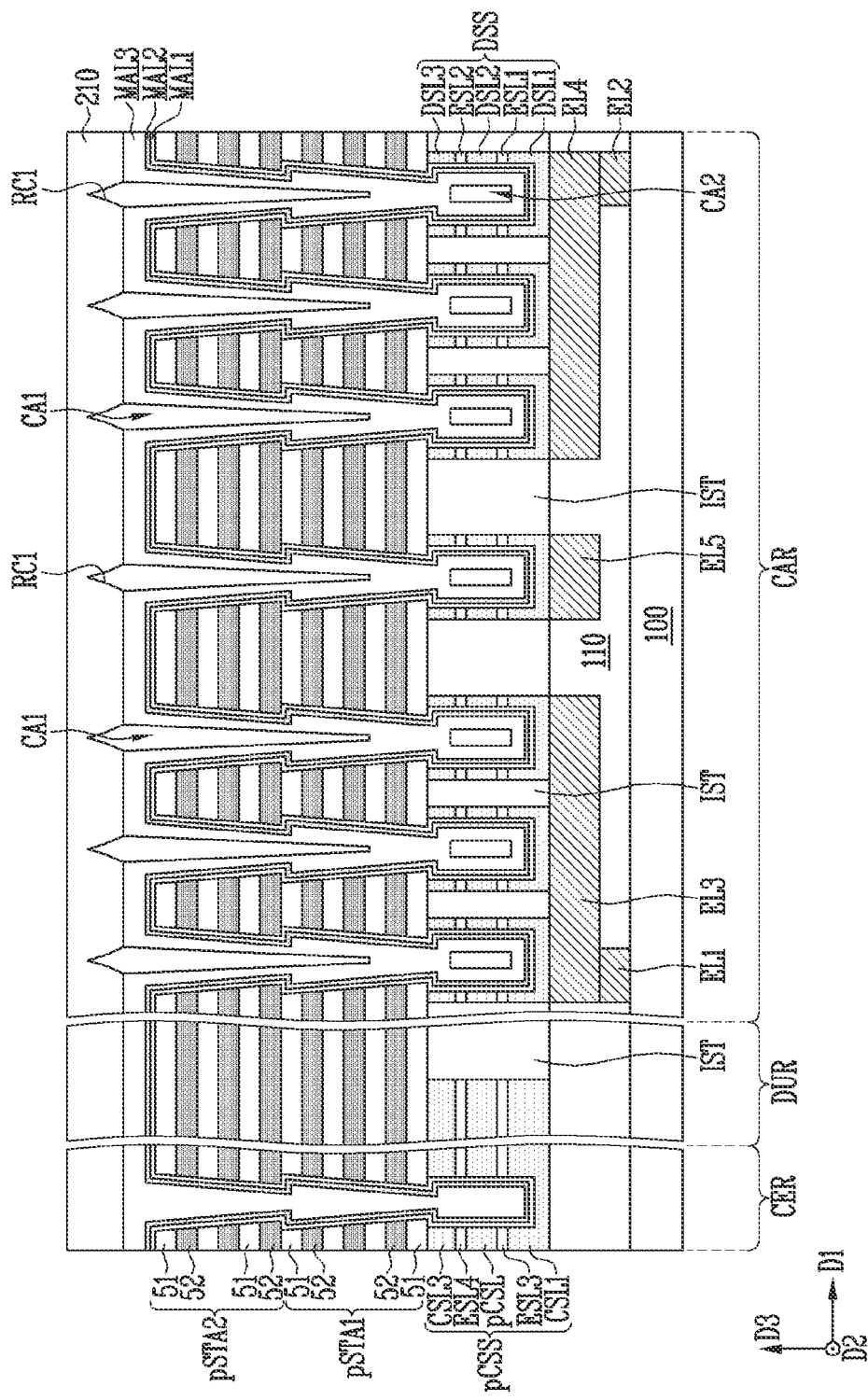

Referring to FIG. 2G, a first capping insulating layer 210 may be formed on the third material layer MAL3. The first cavities CA1 may be covered by the first capping insulating layer 210. The first cavities CA1 may be closed by the first capping insulating layer 210. First recesses RC1 may be defined by the first capping insulating layer 210. The first recesses RC1 may be defined in such a way that the bottom surface of the first capping insulating layer 210 is caved in. The first recesses RC1 may be defined in the first capping insulating layer 210. Each of the first recesses RC1 may be coupled to each of the first cavities CA1. The first recess RC1 may be formed on the first cavity CA1. The first capping insulating layer 210 may include an insulating material. For example, the first capping insulating layer 210 may include an oxide.

Figure 2H:
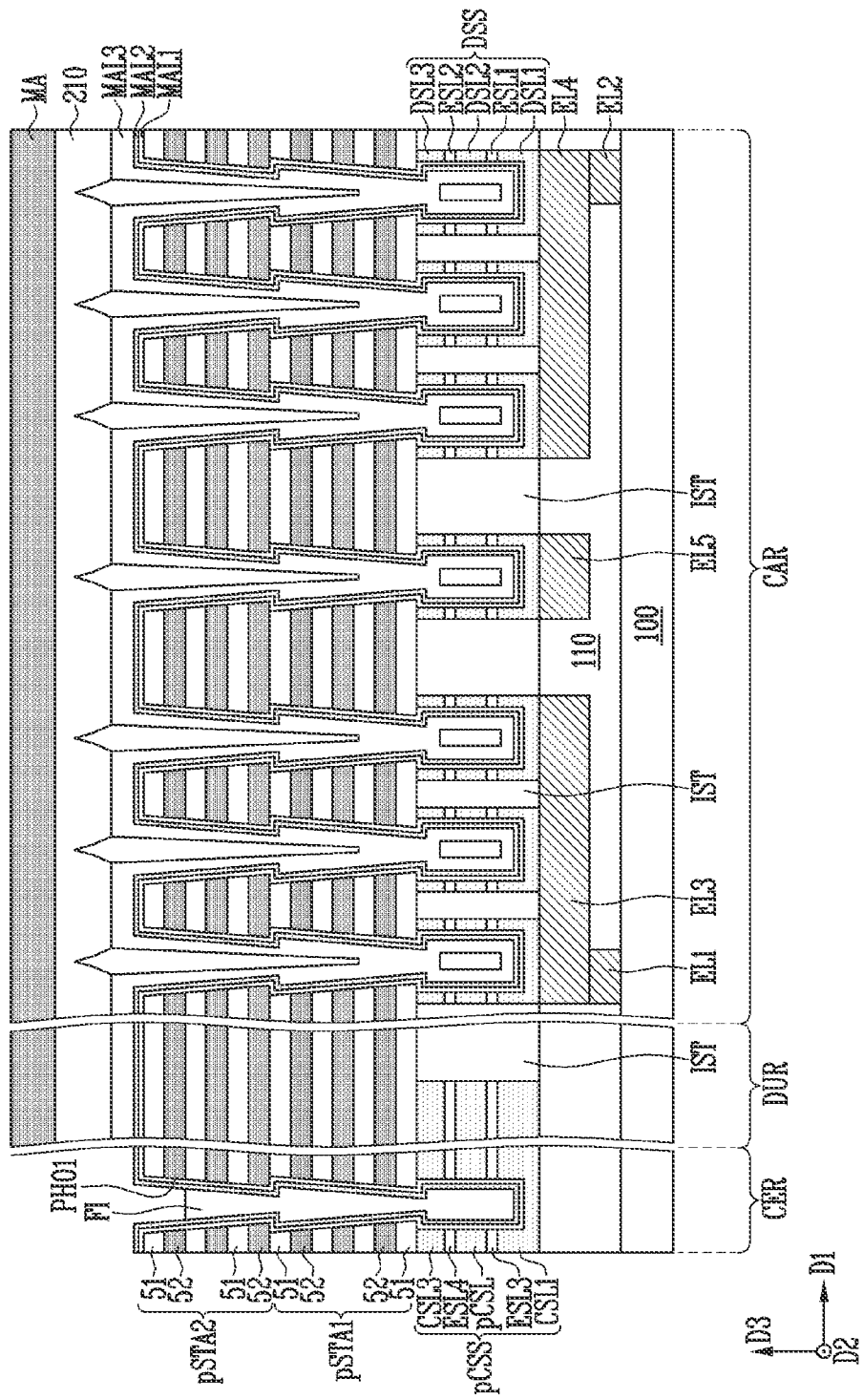
Figure 21:
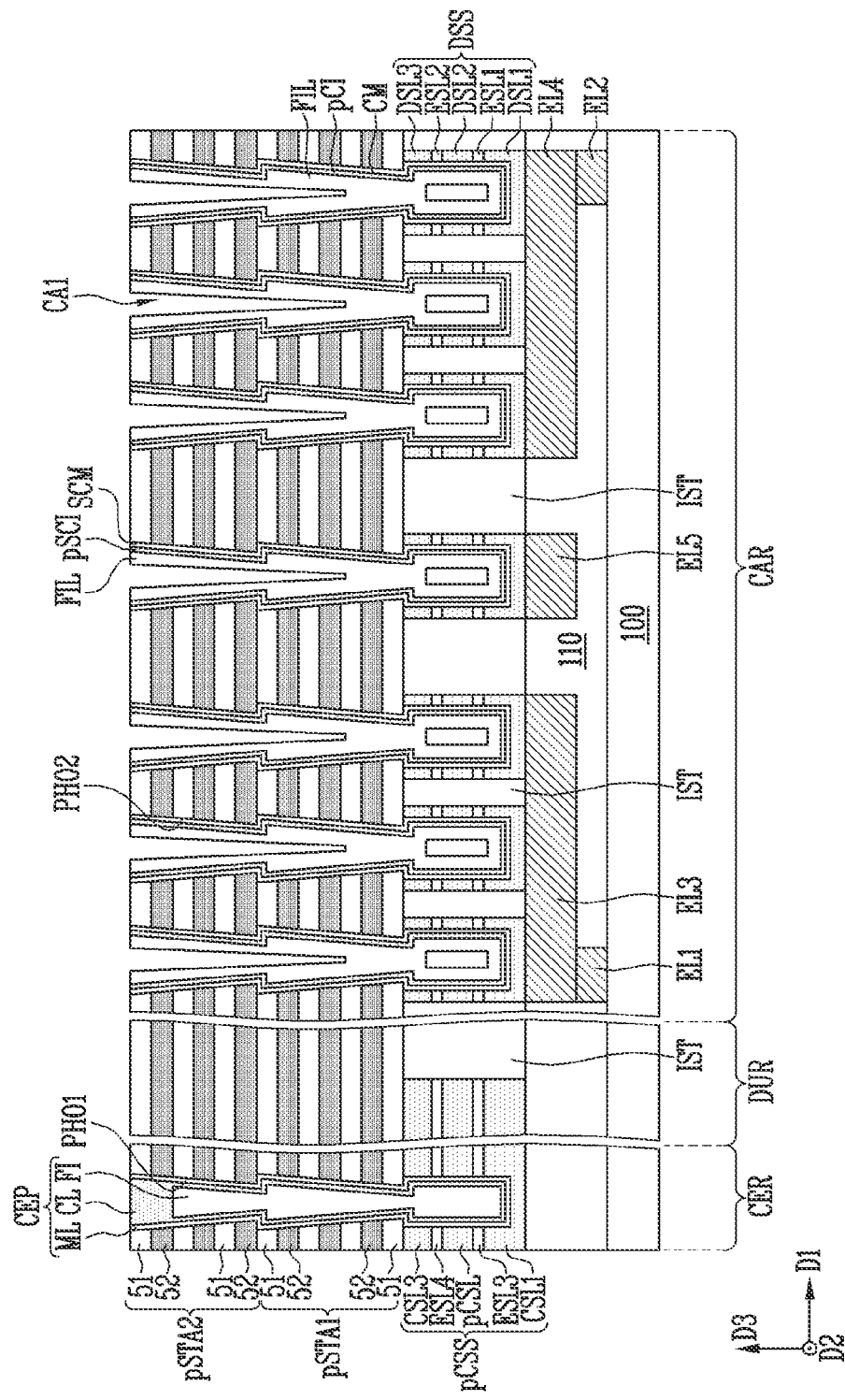

Referring to FIG. 2H, a mask layer MA may be formed on the first capping insulating layer 210. The mask layer MA may expose a portion of the first capping insulating layer 210 disposed over the cell region CER of the substrate 100. Subsequently, using the mask layer MA as an etching barrier, the first capping insulating layer 210 and the third material layer MAL3 may be etched.

The first capping insulating layer 210 and the third material layer MAL3 are etched, whereby a portion of the first capping insulating layer 210 and a portion of the third material layer MAL3, which are disposed over the cell region CER of the substrate 100, may be removed. When the portion of the third material layer MAL3 disposed over the cell region CER of the substrate 100 is removed, a portion of the third material layer MAL3 in the first through hole PHO1 may be separated. The separated portion of the third material layer MAL3 in the first through hole PHO1 may be defined as a filling layer FI.

Referring to FIG. 2I, a material that is the same as the material included in the second material layer MAL2 may be deposited on the filling layer FI. Subsequently, a polishing process may be performed. For example, the polishing process may be a chemical mechanical polishing (CMP) process.

The upper portion of the first material layer MAL1 is removed by the polishing process, whereby the first material layer MAL1 may be separated into a memory layer ML, capacitor multi-layered layers CM, and a sidewall multi-layered layer SCM. The memory layer ML may be located in the first through hole PHO1. The capacitor multi-layered layers CM and the sidewall multi-layered layer SCM may be located in the second through holes PHO2. The upper portion of the second material layer MAL2 is removed by the polishing process, whereby the second material layer MAL2 may be separated into a channel layer CL, preliminary capacitor insulating layers pCI, and a preliminary sidewall insulating layer pSCI. The channel layer CL may be located in the first through hole PHO1. The preliminary capacitor insulating layers pCI and the preliminary sidewall insulating layer pSCI may be located in the second through holes PHO2. The upper portion of the third material layer MAL3 is removed through the polishing process, whereby the third material layer MAL3 may be separated into filling insulating layers FIL in the second through holes PHO2.

The top surface of the second preliminary stacked body pSTA2 may be exposed by the polishing process.

Figure 2J:
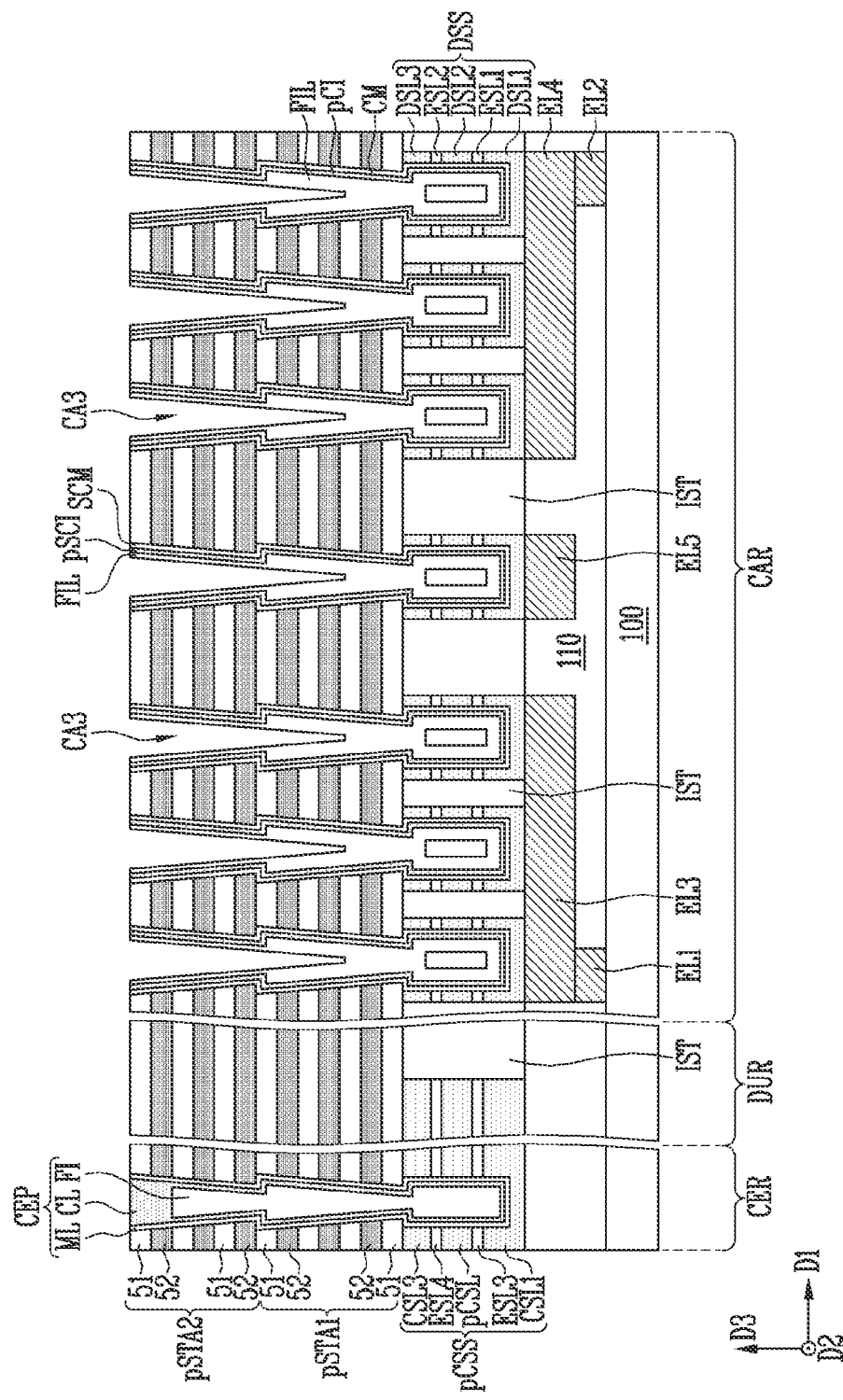

Referring to FIG. 2J, the first cavities CA1 may be extended. The first cavities CA1 may be extended through a clean process through which a portion of the filling insulating layer FIL can be removed. The extended first cavities CA1 may be defined as third cavities CA3.

Figure 2K:
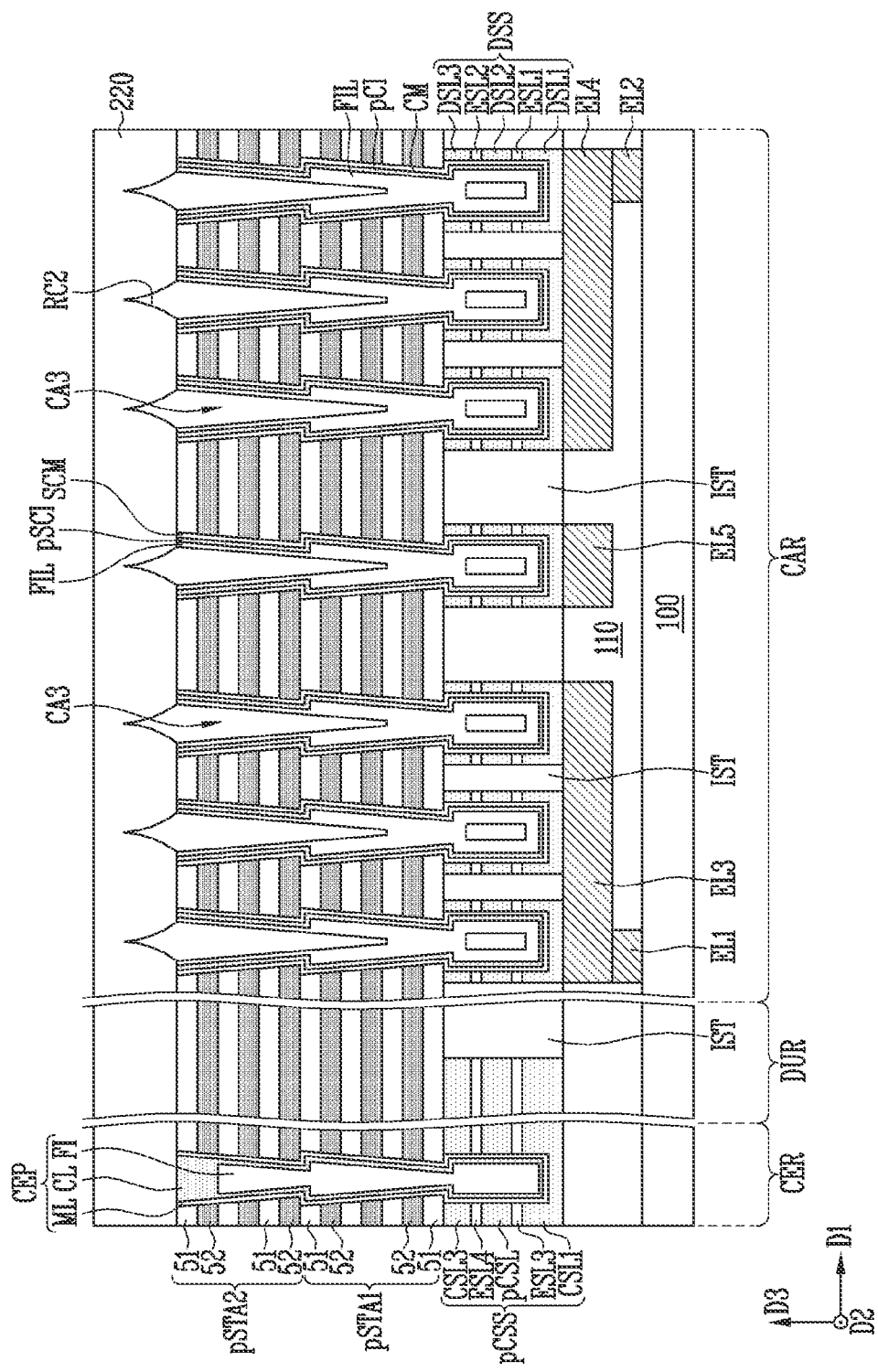

Referring to FIG. 2K, a second capping insulating layer 220 may be formed on the second preliminary stacked body pSTA2. The third cavities CA3 may be covered by the second capping insulating layer 220. The third cavities CA3 may be closed by the second capping insulating layer 220. Second recesses RC2 may be defined by the second capping insulating layer 220. The bottom surface of the second capping insulating layer 220 is caved in, whereby the second recesses RC2 may be defined. The second recesses RC2 may be defined in the second capping insulating layer 220. Each of the second recesses RC2 may be coupled to each of the third cavities CA3. The second recess RC2 may be formed over the second cavity CA2. The second capping insulating layer 220 may include an insulting material. For example, the second capping insulating layer 220 may include an oxide.

Figure 2L:
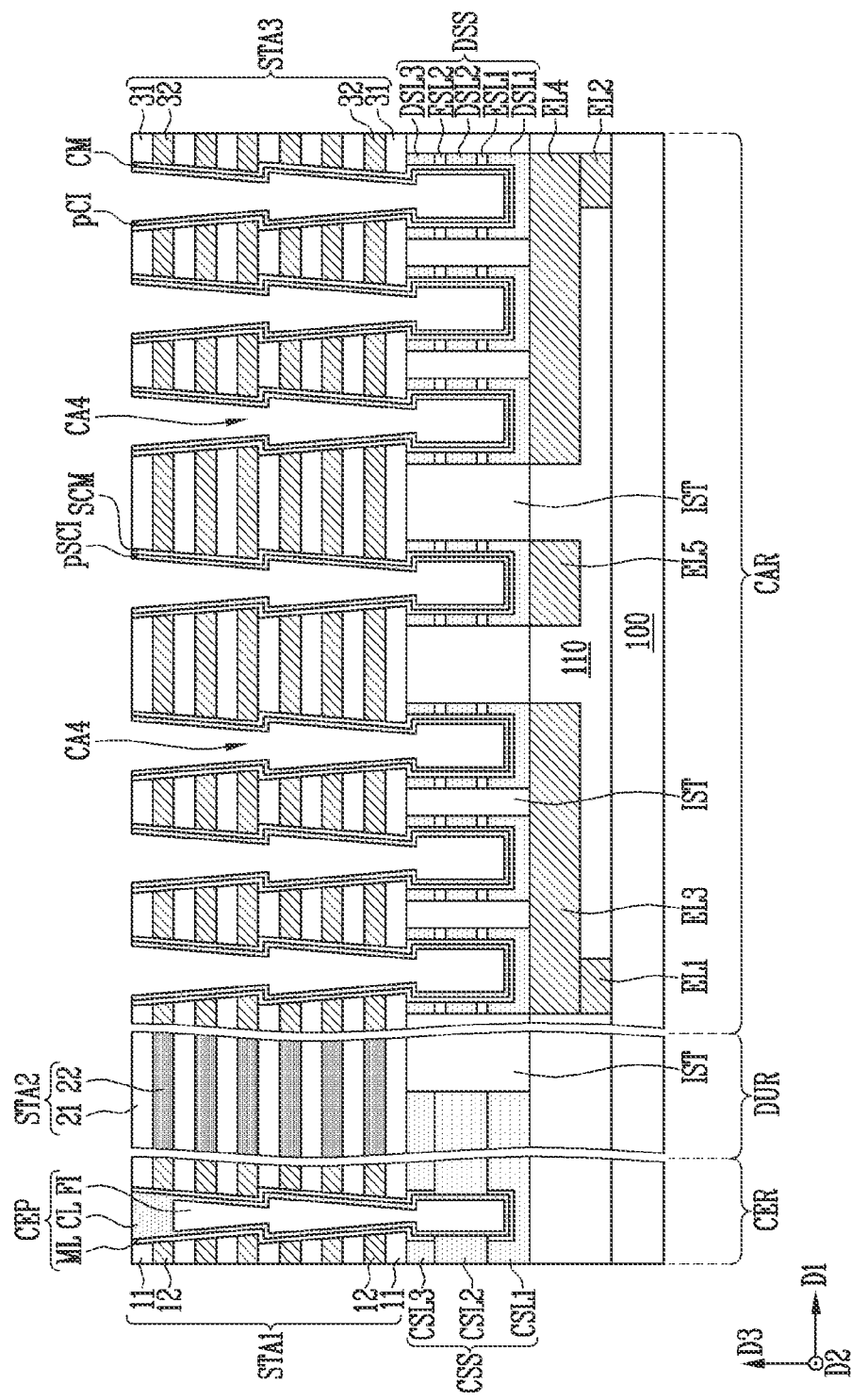

Referring to FIG. 2L, first stacked conductive layers 12, second stacked conductive layers 32, and a cell source structure CSS may be formed. Forming the first stacked conductive layers 12, the second stacked conductive layers 32, and the cell source structure CSS may include forming a slit passing through the first preliminary stacked body pSTA1 and the second preliminary stacked body pSTA2, removing the preliminary cell source layer pCSL, the third etching stop layer ESL3, and the fourth etching stop layer ESL4 through the slit, forming a second cell source layer CSL2 in the empty space from which the preliminary cell source layer pCSL, the third etching stop layer ESL3, and the fourth etching stop layer ESL4 are removed, removing portions of the preliminary stacked sacrificial layers 52 exposed through the slit, and forming the first stacked conductive layers 12 and the second stacked conductive layers 32 in the empty spaces from which the portions of the preliminary stacked sacrificial layers 52 are removed. The portions of the preliminary stacked sacrificial layers 52 exposed through the slit may be portions disposed over the cell region CER and the capacitor region CAR of the substrate 100.

The first stacked conductive layers 12 and the second stacked conductive layers 32 are formed, whereby first to third stacked bodies STA1, STA2 and STA3 may be defined. The first stacked body STA1 may include first stacked insulating layers 11 and the first stacked conductive layers 12. The portions of the preliminary stacked insulating layers 51 disposed over the cell region CER of the substrate 100 may be defined as the first stacked insulating layers 11. The second stacked body STA2 may include second stacked insulating layers 21 and second stacked sacrificial layers 22. The portions of the preliminary stacked insulating layers 51 disposed over the dummy region DUR of the substrate 100 may be defined as the second stacked insulating layers 21. The portions of the preliminary stacked sacrificial layers 52 disposed over the dummy region DUR of the substrate 100 may be defined as the second stacked sacrificial layers 22. The third stacked body STA3 may include third stacked insulating layers 31 and the second stacked conductive layers 32. The portions of the preliminary stacked insulating layers 51 disposed over the capacitor region CAR of the substrate 100 may be defined as the third stacked insulating layers 31.

Subsequently, the second capping insulating layer 220 and the filling insulating layer FIL may be removed. The third cavity CA3 may be extended by removing the filling insulating layer FIL. The extended third cavity CA3 may be defined as a fourth cavity CA4. The preliminary capacitor insulating layer pCI may be exposed through the fourth cavity CA4.

Figure 2M:
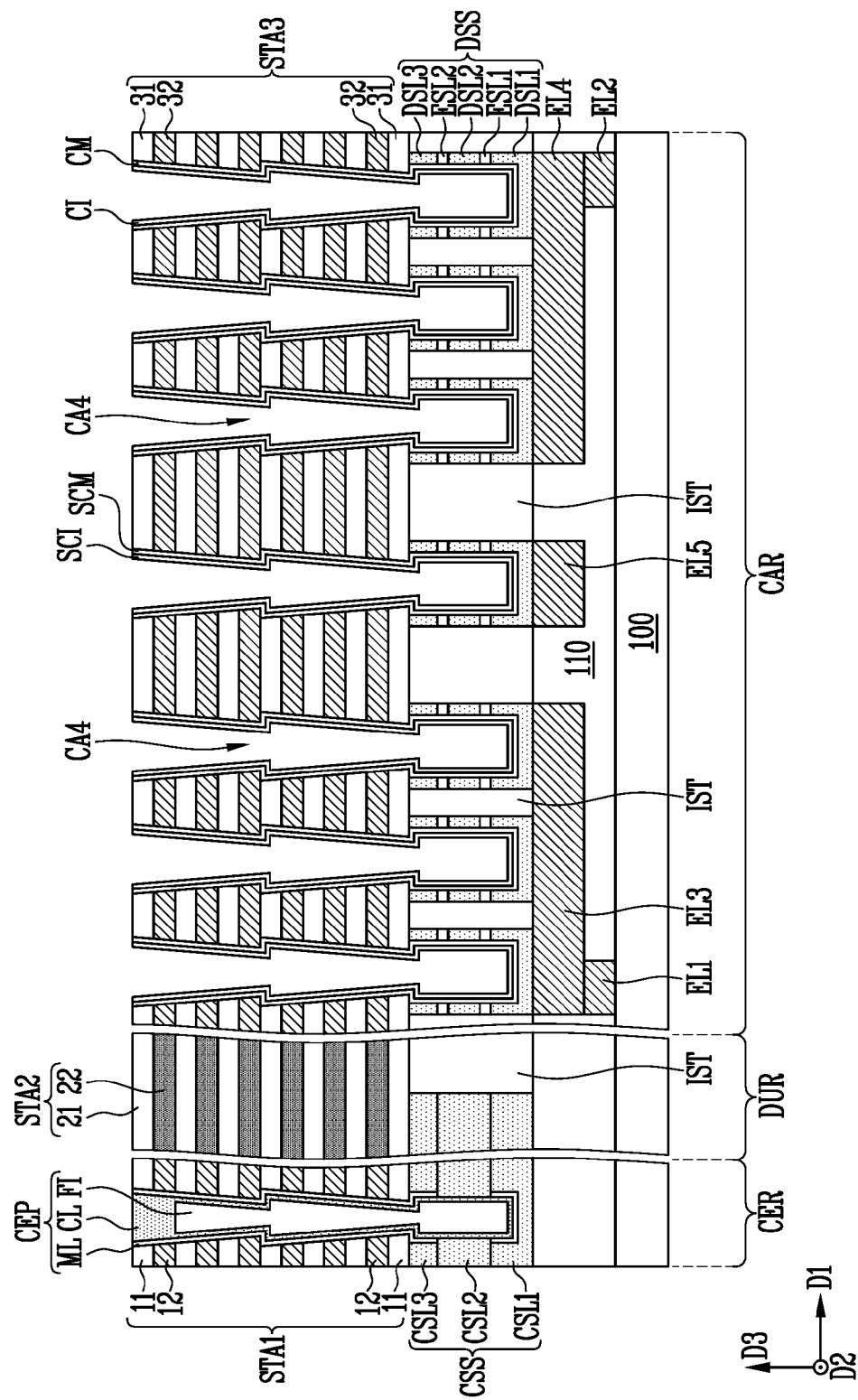

Referring to FIG. 2M, the exposed preliminary capacitor insulating layer pCI and preliminary sidewall insulating layer pSCI may be oxidized. The preliminary capacitor insulating layer pCI and the preliminary sidewall insulating layer pSCI may be oxidized through an oxidization process. The preliminary capacitor insulating layer pCI is oxidized, whereby a capacitor insulating layer CI may be formed. For example, the capacitor insulating layer CI may include a silicon oxide. The preliminary sidewall insulating layer pSCI is oxidized, whereby a sidewall insulating layer SCI may be formed. For example, the sidewall insulating layer SCI may include a silicon oxide.

In another embodiment, forming the capacitor insulating layer CI and the sidewall insulating layer SCI may include removing the exposed preliminary capacitor insulating layer pCI and preliminary sidewall insulating layer pSCI and forming the capacitor insulating layer CI and the sidewall insulating layer SCI through a depositing process.

Figure 2N:
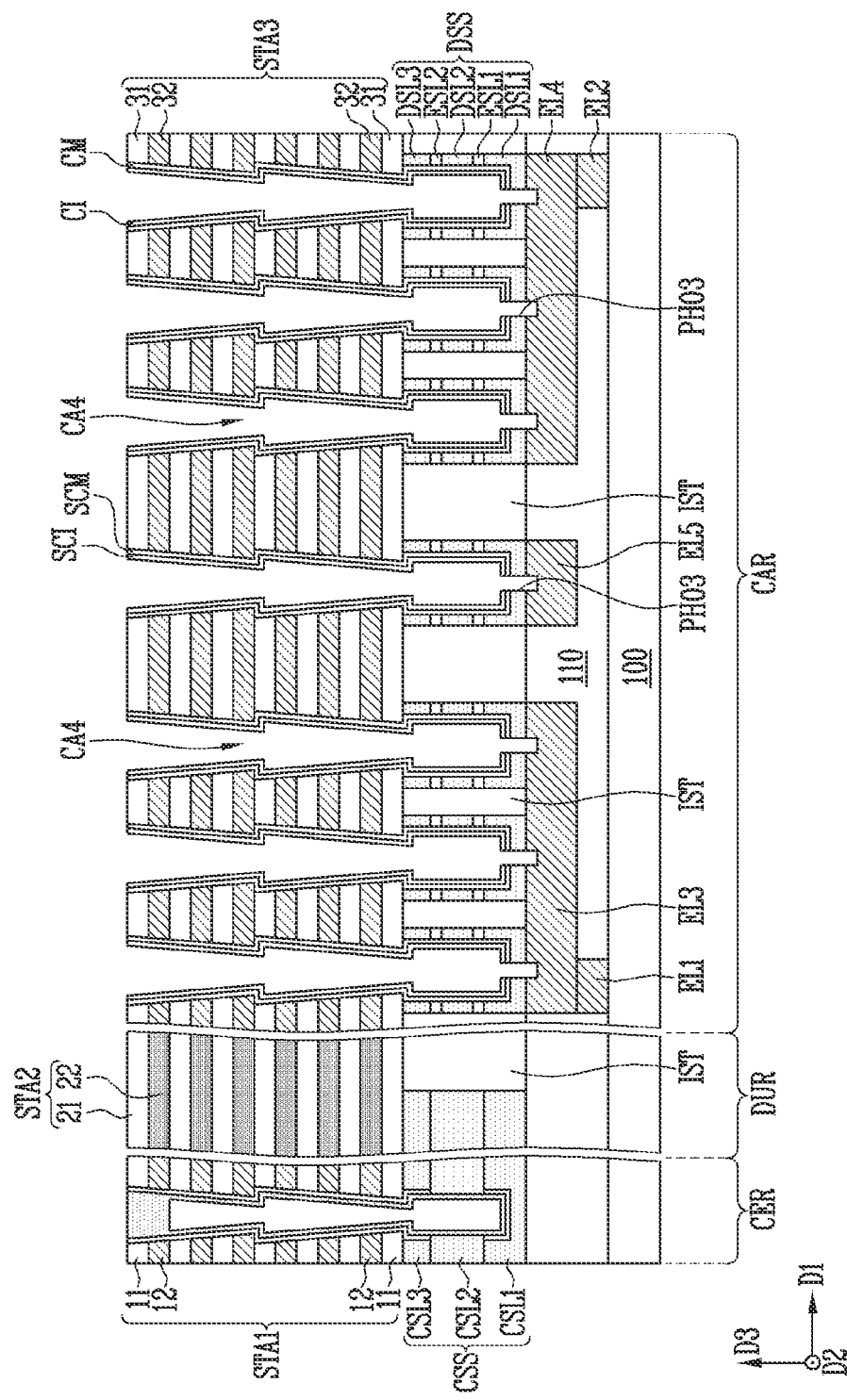
Figure 20:
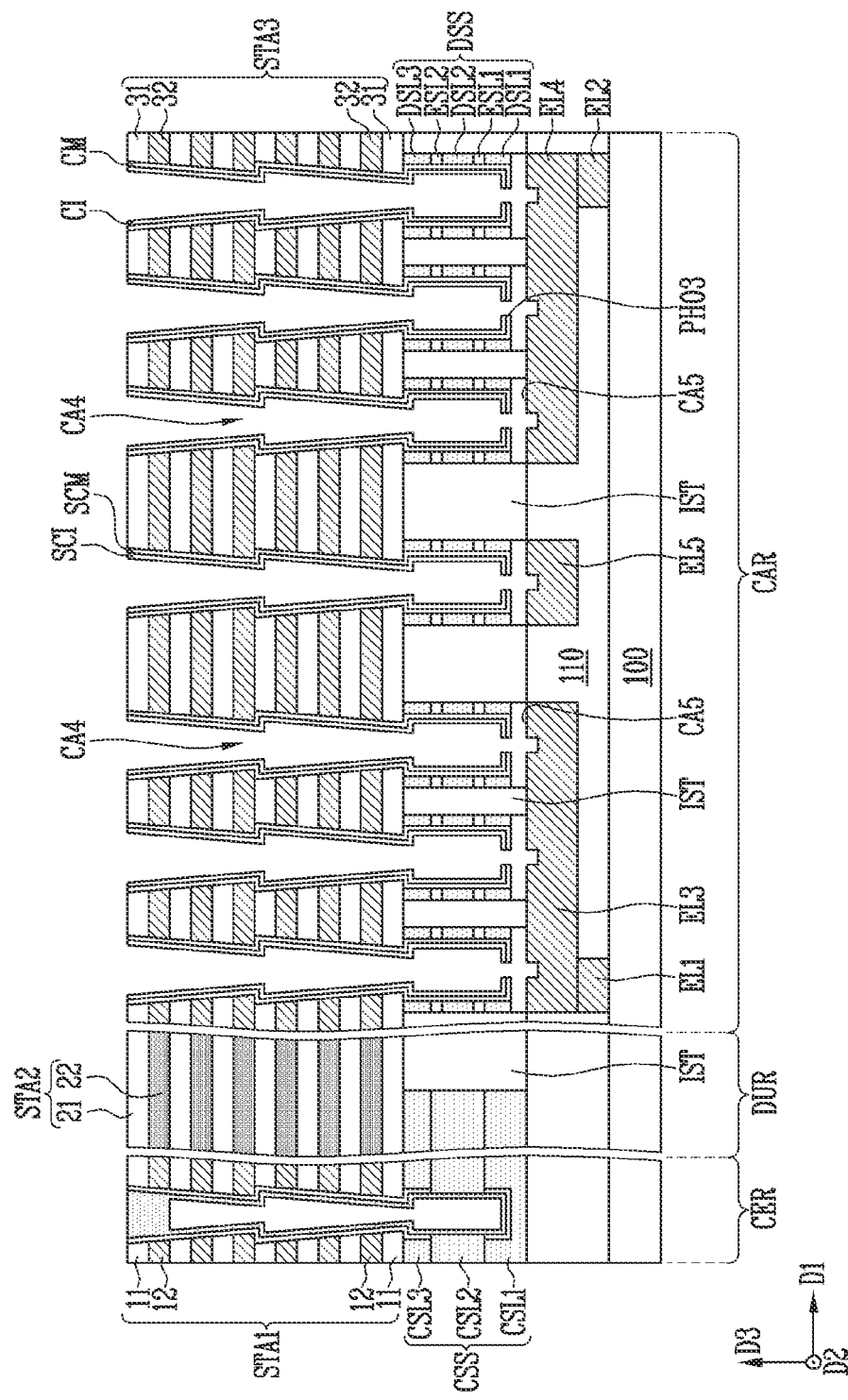

Referring to FIG. 2N, third through holes PHO3 may be formed. Each of the third through holes PHO3 may pass through the lowest portion of the capacitor insulating layer CI and the lowest portion of the capacitor multi-layered layer CM. Forming the third through hole PHO3 may include etching the lowest portion of the capacitor insulating layer CI, the lowest portion of the capacitor multi-layered layer CM, and the first dummy source layer DSL1 of the dummy source structure DSS through the fourth cavity CA4. When the third through holes PHO3 are formed, a portion of the third electrode EL3 and a portion of the fourth electrode EL4 may be etched. When the third through holes PHO3 are formed, the third electrode EL3 and the fourth electrode EL4 may be exposed.

Some of the third through holes PHO3 may pass through the lowest portion of the sidewall insulating layer SCI and the sidewall multi-layered layer SCM. Forming the third through hole PHO3 may include etching the lowest portion of the sidewall insulating layer SCI, the lowest portion of the sidewall multi-layered layer SCM, and the first dummy source layer DSL1 of the dummy source structure DSS through the fourth cavity CA4. When the third through hole PHO3 is formed, a portion of the fifth electrode EL5 may be etched. When the third through hole PHO3 is formed, the fifth electrode EL5 may be exposed.

Referring to FIG. 2O, fifth cavities CA5 may be formed. Forming the fifth cavity CA5 may include etching the sidewall of the first dummy source layer DSL1 exposed by the third through hole PHO3. The fifth cavity CA5 may be formed between the lowest portion of the capacitor multi-layered layer CM and the third electrode EL3, between the lowest portion of the capacitor multi-layered layer CM and the fourth electrode EL4, or between the lowest portion of the capacitor multi-layered layer CM and the first insulating layer 110. The fifth cavity CM5 may be further formed between the lowest portion of the sidewall multi-layered layer SCM and the fifth electrode EL5.

Subsequently, capacitor plugs CAP1 and CAP2 and a connection conductor COC may be formed in the fourth cavity CA4, the third through hole PHO3, and the fifth cavity CA5 (cf. FIGS. 1B and 1D). The capacitor plugs CAP1 and CAP2 and the connection conductor COC may be simultaneously formed. The capacitor plugs CAP1 and CAP2 may be formed in the fourth cavity CA4, and the connection conductor COC may be formed in the third through hole PHO3 and the fifth cavity CA5. When the capacitor plugs CAP1 and CAP2 are formed, a conductive plug CC may be formed along therewith. The conductive plug CC may be formed in the fourth cavity CA4.

Subsequently, a second insulating layer 120 configured to cover the first to third stacked bodies STA1, STA2 and STA3 may be formed, and a bit line contact BCT may be formed in the second insulating layer 120 (cf. FIG. 1B).

Figure 3:
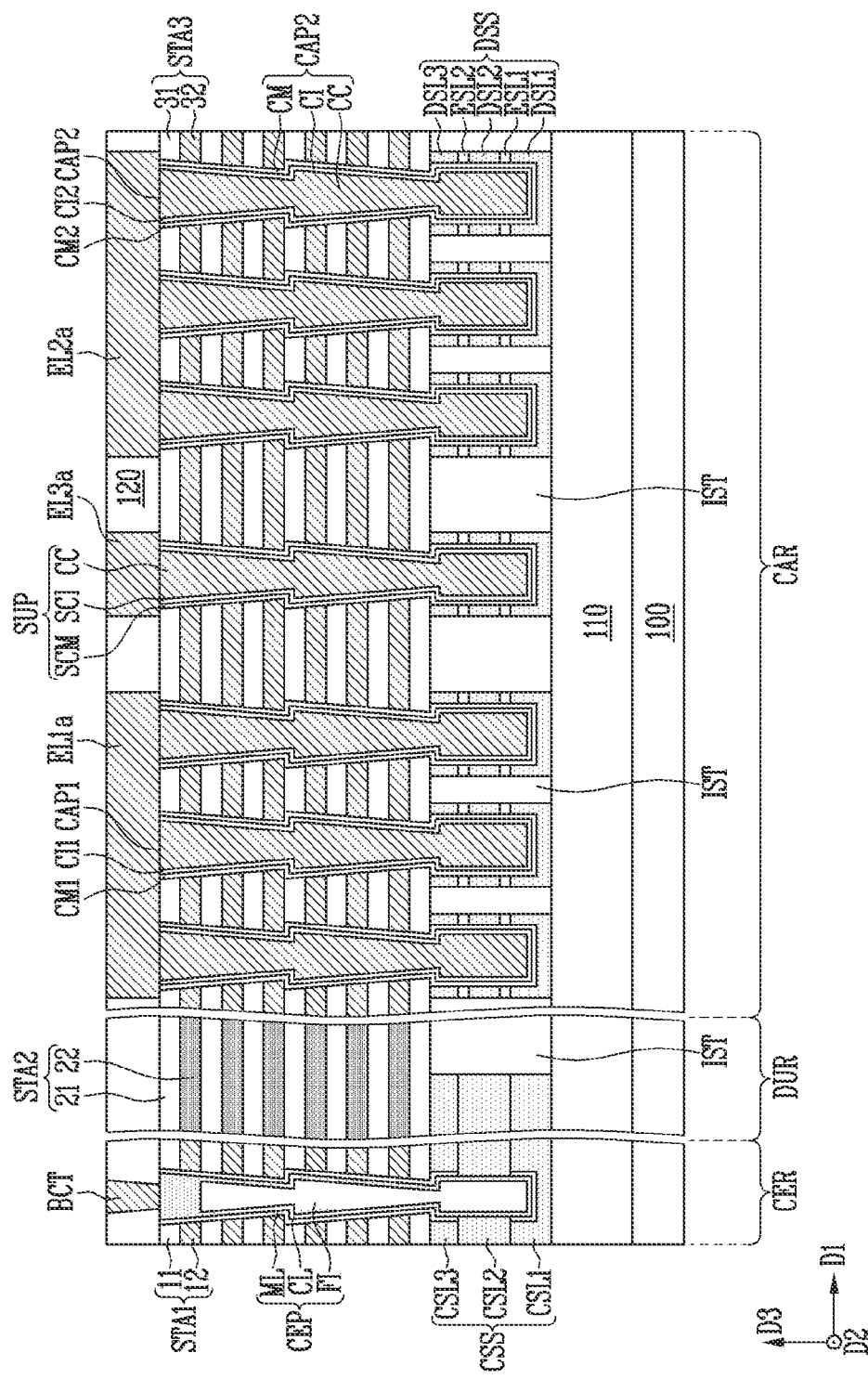
FIG. 3 is a sectional view of a semiconductor device according to an embodiment of the present disclosure.

FIG. 3 is a sectional view of a semiconductor device according to an embodiment of the present disclosure. Hereinbelow, a description redundant with the above description will be omitted.

Referring to FIG. 3, a first electrode EL1a and a second electrode EL2a may be provided in the second insulating layer 120. The first electrode EL1a and the second electrode EL2a may be spaced apart from each other in the first direction D1. The first electrode EL1a may be coupled to the first capacitor plugs CAP1. The second electrode EL2a may be coupled to the second capacitor plugs CAP2. A third electrode EL3a may be further provided in the second insulating layer 120. The third electrode EL3a may be spaced apart from the first electrode EL1a and the second electrode EL2a in the first direction D1. The third electrode EL3a may be coupled to the support plug SUP. The third electrode EL3a may be in an electrically floating state.

The first electrode EL1a, the first capacitor plugs CAP1, the first capacitor multi-layered layers CM1, the first capacitor insulating layers CI1, and the second stacked conductive layers 32 may constitute a first capacitor. The second electrode EL2a, the second capacitor plugs CAP2, the second capacitor multi-layered layers CM2, the second capacitor insulating layers CI2, and the second stacked conductive layers 32 may constitute a second capacitor. The first capacitor and the second capacitor may be coupled in parallel to each other. The support plug SUP may be in an electrically floating state.

Figure 4:
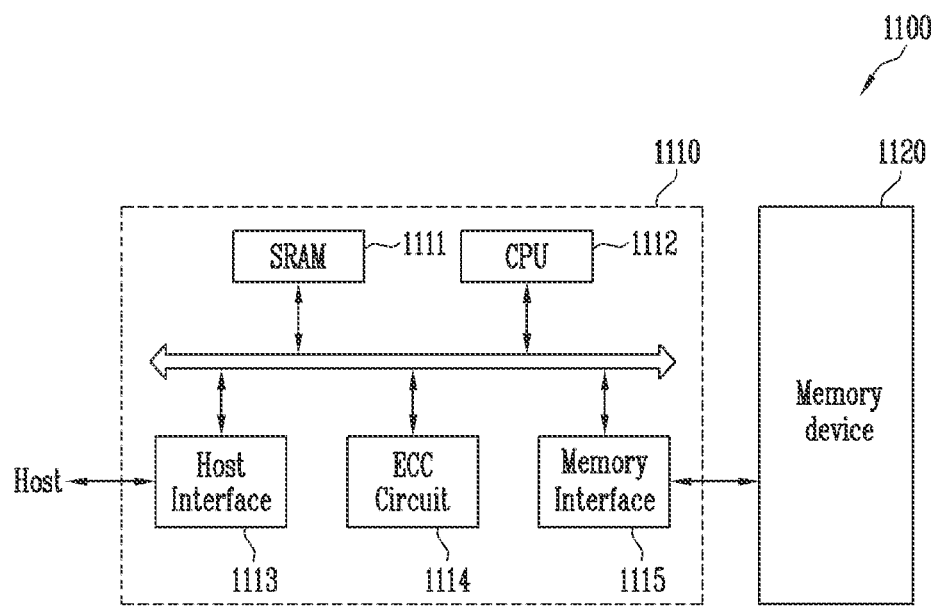
FIG. 4 is a block diagram illustrating the configuration of a memory system according to embodiments of the present disclosure.

FIG. 4 is a block diagram illustrating the configuration of a memory system according to an embodiment of the present disclosure.

Referring to FIG. 4, a memory system 1100 according to an embodiment of the present disclosure includes a memory device 1120 and a memory controller 1110.

The memory device 1120 may include a semiconductor device according to embodiments of the present disclosure. The memory device 1120 may be a multi-chip package composed of a plurality of flash memory chips.

The memory controller 1110 may control the memory device 1120, and may include a static random access memory (SRAM) 1111, a central processing unit (CPU) 1112, a host interface 1113, an error correction code (ECC) circuit 1114, and a memory interface 1115. The SRAM 1111 is used as a working memory of the CPU 1112, the CPU 1112 performs overall control operations for data exchange of the memory controller 1110, and the host interface 1113 is provided with a data interchange protocol of a host coupled to the memory system 1100. Further, the ECC circuit 1114 detects and corrects an error included in the data that is read from the memory device 1120, and the memory interface 1115 interfaces with the memory device 1120. In addition, the memory controller 1110 may further include a read only memory (ROM) or the like that stores code data for interfacing with the host.

The above-described memory system 1100 may be a memory card or a solid state drive (SSD) in which the memory device 1120 and the memory controller 1110 are combined with each other. For example, when the memory system 1100 is an SSD, the memory controller 1110 may communicate with an external device (e.g., host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), or an Integrated Drive Electronics (IDE).

Figure 5:
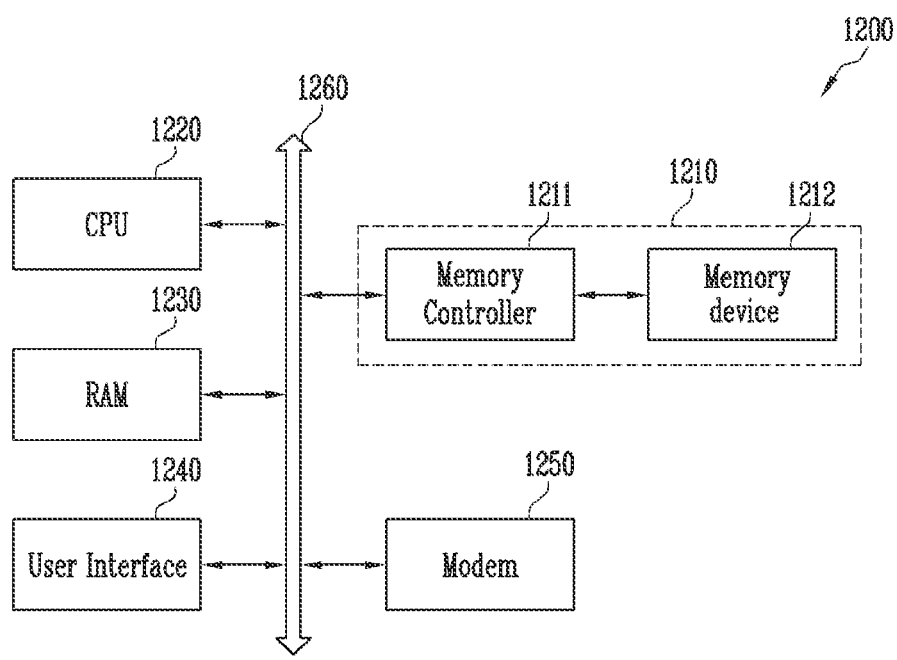
FIG. 5 is a block diagram illustrating the configuration of a computing system according to embodiments of the present disclosure.

FIG. 5 is a block diagram illustrating the configuration of a computing system according to embodiments of the present disclosure.

Referring to FIG. 5, a computing system 1200 according to embodiments of the present disclosure may include a CPU 1220, a random access memory (RAM) 1230, a user interface 1240, a modem 1250, and a memory system 1210 that are electrically coupled to a system bus 1260. Also, when the computing system 1200 is a mobile device, it may further include a battery for supplying an operation voltage to the computing system 1200, and may further include an application chip set, a camera image processor, a mobile DRAM, etc.

The memory system 1210 may be configured using a memory device 1212 and a memory controller 1211, similar to those described with reference to FIG. 4.

A semiconductor device according to embodiments of the present disclosure is configured such that capacitor plugs and stacked conductive layers forming a capacitor are coupled in parallel, whereby the operation reliability of the capacitor may be improved.

What is claimed is:

1. A method of manufacturing a semiconductor device, comprising:
   forming a preliminary stacked body by alternately stacking preliminary stacked insulating layers and preliminary stacked sacrificial layers;
   forming a first through hole and a second through hole, each passing through the preliminary stacked body;
   forming a first material layer on a surface of the first through hole and a surface of the second through hole;
   forming a second material layer on the first material layer;
   separating the first material layer into a memory layer in the first through hole and a capacitor multi-layered layer in the second through hole;
   separating the second material layer into a channel layer in the first through hole and a preliminary capacitor insulating layer in the second through hole; and
   oxidizing the preliminary capacitor insulating layer, thereby forming a capacitor insulating layer.

2. The method according to claim 1, further comprising:
   forming a capacitor plug in the capacitor insulating layer.

3. The method according to claim 1, further comprising:
forming a third material layer on the second material layer.

4. The method according to claim 3, wherein forming the third material layer comprises:
forming a cavity defined by the third material layer in the second through hole; and
filling the first through hole with the third material layer.

5. The method according to claim 1, further comprising:
forming a first electrode and a second electrode spaced apart from each other; and
forming a dummy source structure on the first electrode and the second electrode.

6. The method according to claim 5, further comprising:
forming a lower sacrificial structure in the dummy source structure,
wherein forming the second through hole comprises removing the lower sacrificial structure.

7. The method according to claim 1, further comprising:
forming a third through hole passing through a lowest portion of the capacitor multi-layered layer and a lowest portion of the capacitor insulating layer.

8. The method according to claim 7, further comprising:
forming an electrode before forming the preliminary stacked body,
wherein the third through hole exposes the electrode.

9. The method according to claim 7, further comprising:
forming a capacitor plug in the second through hole and the third through hole.

\* \* \* \* \*